（12） United States Patent
Fuwa

(10) Patent No.: US 11,511,352 B2
(45) Date of Patent: Nov. 29, 2022

(54) COATED CUTTING TOOL AND PRODUCTION METHOD THEREFOR

(71) Applicant: MOLDINO Tool Engineering, Ltd., Tokyo (JP)

(72) Inventor: Ryoutarou Fuwa, Narita (JP)

(73) Assignee: MOLDINO Tool Engineering, Ltd., Tokyo (JP)

( * ) Notice: Subject to any disclaimer, the term of this patent is extended or adjusted under 35 U.S.C. 154(b) by 0 days.

(21) Appl. No.: 17/048,666

(22) PCT Filed: Mar. 27, 2019

(86) PCT No.: PCT/JP2019/013106
§ 371 (c)(1),
(2) Date: Oct. 19, 2020

(87) PCT Pub. No.: WO2019/230166
PCT Pub. Date: Dec. 5, 2019

(65) Prior Publication Data
US 2021/0162510 A1 Jun. 3, 2021

(30) Foreign Application Priority Data
May 30, 2018 (JP) .............................. JP2018-103480

(51) Int. Cl.
*B23B 27/14* (2006.01)
*B23C 5/16* (2006.01)
(Continued)

(52) U.S. Cl.
CPC .............. *B23B 27/148* (2013.01); *B23C 5/16* (2013.01); *C23C 14/0641* (2013.01);
(Continued)

(58) Field of Classification Search
CPC ... B23B 27/14; B23B 27/148; B23B 2228/10; B23B 2228/105; B23C 5/16;
(Continued)

(56) References Cited

U.S. PATENT DOCUMENTS

2007/0172675 A1* 7/2007 Omori .................. C23C 30/005
428/698
2007/0218242 A1* 9/2007 Moriguchi .......... C23C 14/0641
428/98
(Continued)

FOREIGN PATENT DOCUMENTS

CN 101090790 A 12/2007
EP 2177295 A1 4/2010
(Continued)

OTHER PUBLICATIONS

International Search Report dated Jul. 2, 2019, issued for PCT/JP2019/013106 and English translation thereof.
(Continued)

*Primary Examiner* — Seth Dumbris
(74) *Attorney, Agent, or Firm* — Locke Lord LLP; James E. Armstrong, IV; Nicholas J. DiCeglie, Jr.

(57) ABSTRACT

Provided is a coated cutting tool having a base material side single layer portion and a laminated portion provided as a hard coating in order from a base material side. The base material side single layer portion is formed of a nitride-based hard coating in which a proportion of Al is highest among metal (including metalloid) elements, a sum of Al and Cr in a content ratio (atomic ratio) is 0.9 or more, and at least B is contained. In the laminated portion, a nitride-based a layer in which a proportion of Ti is highest among metal (including metalloid) elements and at least B is contained, and a nitride-based b layer in which a proportion
(Continued)

of Al is highest among metal (including metalloid) elements and at least Cr and B are contained are alternately laminated.

20 Claims, 8 Drawing Sheets

(51) Int. Cl.
    *C23C 28/00*     (2006.01)
    *C23C 14/06*     (2006.01)
    *C23C 14/32*     (2006.01)

(52) U.S. Cl.
    CPC ........ *C23C 14/0647* (2013.01); *C23C 14/325* (2013.01); *C23C 28/40* (2013.01); *B23B 2228/10* (2013.01); *B23B 2228/105* (2013.01)

(58) Field of Classification Search
    CPC ... C23C 14/0641; C23C 14/325; C23C 28/40; C23C 28/42; C23C 28/44
    USPC .......................................... 428/697, 698, 699
    See application file for complete search history.

(56) References Cited

U.S. PATENT DOCUMENTS

| | | | |
|---|---|---|---|
| 2007/0269610 A1 | 11/2007 | Fukui et al. | |
| 2010/0263503 A1* | 10/2010 | Fontaine | C08J 7/0427 428/697 |
| 2011/0014426 A1 | 1/2011 | Ohtomo | |
| 2013/0052477 A1* | 2/2013 | Lechthaler | C23C 28/04 428/623 |
| 2014/0193623 A1 | 7/2014 | Setoyama et al. | |
| 2015/0056431 A1* | 2/2015 | Arnd | C23C 14/345 428/213 |
| 2018/0044773 A1* | 2/2018 | Eriksson | C23C 28/042 |
| 2018/0099335 A1 | 4/2018 | Takeshita et al. | |
| 2018/0117680 A1 | 5/2018 | Tanaka | |

FOREIGN PATENT DOCUMENTS

| | | |
|---|---|---|
| EP | 3170919 A1 | 5/2017 |
| JP | 2004-136430 A | 5/2004 |
| JP | 2009-220259 A | 10/2009 |
| JP | 4714186 B2 | 6/2011 |
| JP | 2013-518987 A | 5/2013 |
| JP | 5684829 B2 | 3/2015 |
| JP | 2018-505310 A | 2/2018 |
| KR | 10-2017-0117131 A | 10/2017 |
| WO | 2011/095292 A1 | 8/2011 |
| WO | 2014/157688 A1 | 10/2014 |
| WO | 2016/102170 A1 | 6/2016 |
| WO | 2017/169498 A1 | 10/2017 |

OTHER PUBLICATIONS

Office Action issued in Korean Patent Application No. KR 10-2020-7031180, dated Nov. 30, 2021.
Extended European Search Report issued in European Patent Application No. EP 19810081.0, dated Jan. 21, 2022.
Office Action (Partial Search Report) issued in corresponding Chinese Patent Application No. CN 201980029433.0, dated Sep. 23, 2022.

* cited by examiner

COATED CUTTING TOOL AND PRODUCTION METHOD THEREFOR

TECHNICAL FIELD

The present invention relates to a coated cutting tool that exhibits excellent wear resistance and a method for producing the same.

Priority is claimed on Japanese Patent Application No. 2018-103480, filed May 30, 2018, the content of which is incorporated herein by reference.

BACKGROUND ART

Various coated cutting tools for use in severe cutting works (high-feed work, high-speed work, and the like) have been proposed.

Japanese Patent No. 4714186 (Patent Document 1) discloses a coated cutting tool having a multilayer coating layer in which two or more first coating formation layers made of (AlCrB)N or (AlCrB)CN and unavoidable impurities, and two or more second coating formation layers made of SiN, SiCN, CN, or CNB and unavoidable impurities are alternately laminated on a base material.

Published Japanese Translation No. 2018-505310 of the PCT International Publication (Patent Document 2) discloses a coating (paragraphs 0022 and 0024, and FIG. 2) having a base layer 212 made of (AlCr)N, a multilayer coating 216 formed by laminating an A layer made of (AlCrB)N and a B layer made of (AlCr)N, and an outermost layer 220 made of (AlCrB)N in this order on a base material.

Japanese Patent No. 5684829 (Patent Document 3) discloses a multilayer coating system (paragraph 0014) having a multilayer structure in which (AlCrB)N individual layers and (TiAl)N individual layers are alternately laminated on a base material.

Japanese Unexamined Patent Application, First Publication No. 2004-136430 (Patent Document 4) discloses that a multilayer structure is formed by laminating a (TiB)N coating and a (TiAlN)-based hard coating or a (CrAl)N-based hard coating having excellent oxidation resistance (paragraph 0017).

CITATION LIST

Patent Document

[Patent Document 1]
Japanese Patent No. 4714186
[Patent Document 2]
Published Japanese Translation No. 2018-505310 of the PCT International Publication
[Patent Document 3]
Japanese Patent No. 5684829
[Patent Document 4]
Japanese Unexamined Patent Application, First Publication No. 2004-136430

SUMMARY OF INVENTION

Technical Problem

In a case where carbon steel (work material) is cut using the coated cutting tools described in Patent Documents 1 and 2, flank face wear is suppressed due to the characteristics of the AlCrN-based coating of the cutting tool, but rake face wear is easy to progress.

Both the multilayer coating system described in Patent Document 3 and the coated tool described in Patent Document 4 lack a laminated portion (combination of an a layer and a b layer) according to the present invention and cannot suppress flank face wear and rake face wear in a balanced manner.

Therefore, an object of the present invention is to provide a novel and high-performance coated cutting tool that exhibits better wear resistance than a coated cutting tool formed with an (AlCr)N coating or a (TiB)N coating in the related art, and a method for producing the same.

Solution to Problem

A coated cutting tool of the present invention is a coated cutting tool having a hard coating on a base material, in which a base material side single layer portion and a laminated portion are provided as the hard coating in order from a base material side, the base material side single layer portion is formed of a nitride-based hard coating in which a proportion of Al is highest among metal (including metalloid) elements, a sum of Al and Cr in a content ratio (atomic ratio) is 0.9 or more, and at least B is contained, in the laminated portion, a nitride-based a layer in which a proportion of Ti is highest among metal (including metalloid) elements and at least B is contained, and a nitride-based b layer in which a proportion of Al is highest among metal (including metalloid) elements and at least Cr and B are contained are alternately laminated, a lamination period of the a layer and the b layer in a coating thickness direction is 5 to 100 nm, and an X-ray diffraction pattern of a portion formed of the base material side single layer portion and the laminated portion has a single fcc structure.

In the coated cutting tool, it is preferable that a coating thickness (t1) of the base material side single layer portion is 1.0 to 5 μm, a coating thickness (t2) of an entirety of the laminated portion is 0.5 to 2.5 μm, and a coating thickness ratio (t1/t2) of the base material side single layer portion to the entirety of the laminated portion is 1.0 to 5.

In the coated cutting tool, it is preferable that a surface side single layer portion is provided on the laminated portion, and a coating thickness (t3) of the surface side single layer portion is 0.3 to 5 μm, an X-ray diffraction pattern of a portion formed of the base material side single layer portion, the laminated portion, and the surface side single layer portion has a single fcc structure, and the surface side single layer portion is formed of a nitride-based hard coating in which contains a proportion of Al is highest among metal (including metalloid) elements, a sum of Al and Cr in a content ratio (atomic ratio) is 0.9 or more, and at least B is contained.

In the coated cutting tool, it is preferable that a ratio I(200)/I(111) of an X-ray diffraction peak value I(200) of a (200) plane to an X-ray diffraction peak value I(111) of a (111) plane in the X-ray diffraction pattern is 0.2 to 0.37.

In the coated cutting tool, it is preferable that a ratio I(311)/I(111) of an X-ray diffraction peak value I(311) of a (311) plane to an X-ray diffraction peak value I(111) of a (111) plane in the X-ray diffraction pattern is 0.03 to 0.15.

A method for producing a coated cutting tool of the present invention is a method for producing the coated cutting tool by an arc ion plating method, in which a target for forming the base material side single layer portion and the b layer is formed of an AlCrB alloy or AlCrBC alloy having a composition represented by the following general formula, excluding unavoidable impurities: $Al_\alpha Cr_{1-\alpha-\beta-\gamma} B_\beta C_\gamma$ (here, $\gamma$, $1-\alpha-\beta-\gamma$, $\beta$, and $\gamma$ are numbers that respectively represent atomic ratios of Al, Cr, B, and C, and satisfy 0.4≤α≤0.8, 0.04≤β≤0.165, and 0≤γ≤0.035), a target for forming the a layer is formed of a TiB alloy having a composition represented by the following general formula, excluding unavoidable impurities: $Ti_{1-\delta}B_\delta$ (here, 1-δ and δ are numbers that respectively represent atomic ratios of Ti and B, and satisfy 0.1≤δ≤0.5), and in a nitrogen gas atmosphere with a total pressure of 2.7 to 3.3 Pa, a temperature of the base material is set to 400° C. to 550° C., a bias voltage applied to the base material when forming the base material side single layer portion is set to −160 to −100 V, and a bias voltage applied to the base material when forming the laminated portion is set to −140 to −80 V.

In the method for producing the coated cutting tool, it is preferable that the method includes: a step of forming a surface side single layer portion on the laminated portion, in which a bias voltage applied to the base material when forming the surface side single layer portion is set to −160 to −100 V.

In the method for producing the coated cutting tool, it is preferable that the same AlCrB alloy or AlCrBC alloy as that of the base material side single layer portion is used as a target for forming the surface side single layer portion.

In the method for producing the coated cutting tool, it is preferable that an arc current is caused to flow simultaneously to the target for forming the a layer and the target for forming the b layer when forming the laminated portion.

Advantageous Effects of Invention

The coated cutting tool of the present invention includes: the base material; and the hard coating provided on the base material, in which the base material side single layer portion and the laminated portion are provided as the hard coating from the base material side, the base material side single layer portion is formed of the nitride-based hard coating in which the proportion of Al is highest among metal (including metalloid) elements, the sum of Al and Cr in a content ratio (atomic ratio) is 0.9 or more, and at least B is contained, in the laminated portion, the nitride-based a layer in which the proportion of Ti is highest among metal (including metalloid) elements and at least B is contained, and the nitride-based b layer in which the proportion of Al is highest among metal (including metalloid) elements and at least Cr and B are contained are alternately laminated, the lamination period of the a layer and the b layer in the coating thickness direction is 5 to 100 nm, and the X-ray diffraction pattern of the portion formed of the base material side single layer portion and the laminated portion has a single fcc structure. For this reason, flank face wear and rake face wear are suppressed in a well-balanced manner compared to a coated cutting tool in the related art formed with an (AlCr)N coating or a (TiB)N coating. Due to this action, the coated cutting tool of the present invention has high performance and a long life.

According to the method for producing the coated cutting tool of the present invention, it is possible to provide the novel and high-performance coated cutting tool of the present invention.

DESCRIPTION OF EMBODIMENTS

Although embodiments of the present invention will be described in detail below, the present invention is not limited thereto, and changes or modifications may be appropriately added without departing from the technical idea of the present invention based on ordinary knowledge of person skilled in the art. In addition, the description of one embodiment can be applied to other embodiments as it is, unless otherwise specified.

[1] Coated Cutting Tool

A coated cutting tool of the present embodiment has a base material, a hard coating provided on the base material, in which a base material side single layer portion and a laminated portion are provided as the hard coating in order from a base material side, the base material side single layer portion is formed of a nitride-based hard coating in which a proportion of Al is highest among metal (including metalloid) elements, a sum of Al and Cr in a content ratio (atomic ratio) is 0.9 or more, and at least B is contained. In the laminated portion, a nitride-based a layer in which a proportion of Ti is highest among metal (including metalloid)

elements and at least B is contained, and a nitride-based b layer in which a proportion of Al is highest among metal (including metalloid) elements and at least Cr and B are contained are alternately laminated. A lamination period of the a layer and the b layer in a coating thickness direction is 5 to 100 nm. An X-ray diffraction pattern of a portion formed of the base material side single layer portion and the laminated portion has a single fcc structure.

Figure 2:
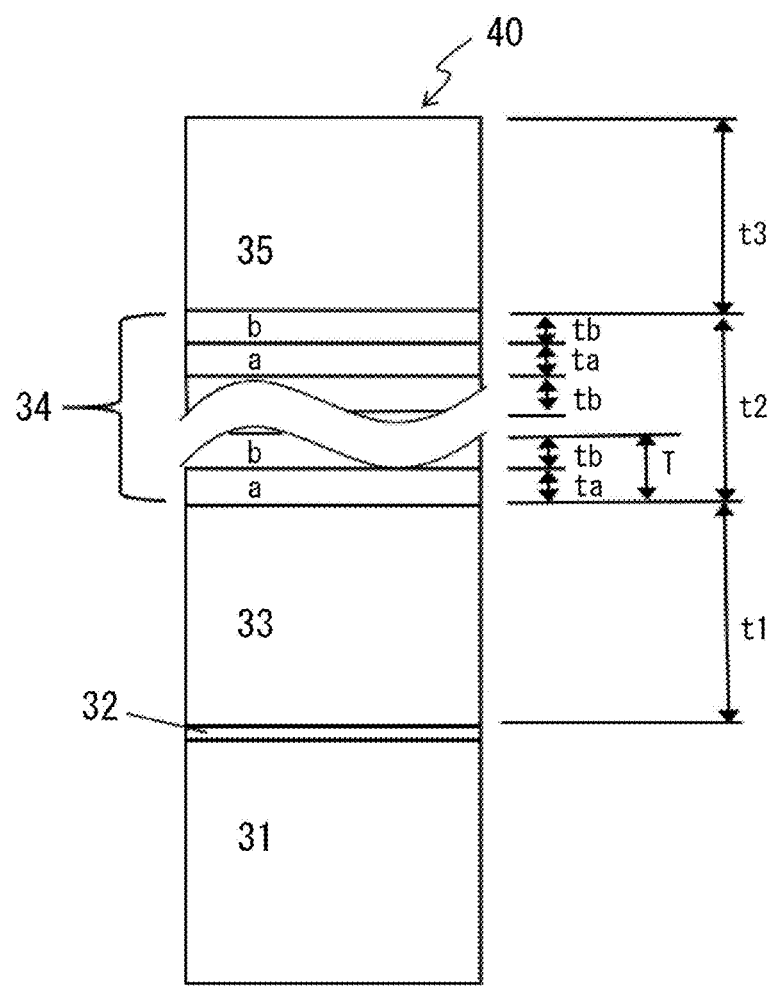
FIG. 2 is a schematic view illustrating an example of a cross-sectional structure of the coated cutting tool of the present invention.

FIG. 2 is a schematic view showing an example of a cross section of a coated cutting tool 40 of the embodiment. The coated cutting tool 40 includes a base material 31, a modified layer 32 provided on the surface of the base material 31 as necessary, and a base material side single layer portion 33 and a laminated portion 34 that are sequentially provided on the modified layer 32. The laminated portion 34 is a layer in which the a layer and the b layer are alternately deposited in the above-mentioned lamination period.

The coated cutting tool 40 has a hard coating including at least the base material side single layer portion 33 and the laminated portion 34. The coated cutting tool 40 may have a hard coating formed of the base material side single layer portion 33, the laminated portion 34, and a surface side single layer portion 35. The X-ray diffraction pattern of a portion of the hard coating portion preferably has a single fcc structure.

(A) Base Material

The base material needs to be a material having sufficient heat resistance and to which a physical vapor deposition method can be applied. Examples of the material of the base material include cemented carbide, cermet, high-speed steel, tool steel, and ceramics such as cubic boron nitride (cBN). The material of the base material is preferably a cemented carbide base material or a ceramic base material from the viewpoint of strength, hardness, wear resistance, toughness, thermal stability, and the like. The cemented carbide consists of tungsten carbide particles and a binder phase of Co or an alloy primarily containing Co. The binder phase content is preferably 1% to 13.5% by mass, and more preferably 3% to 13% by mass with respect to the total content (100% by mass) of the tungsten carbide and the binder phase. When the binder phase content in the cemented carbide is less than 1% by mass, the toughness is insufficient, and when the binder phase content exceeds 13.5% by mass, the hardness (wear resistance) is insufficient. The hard coating of the present embodiment can be formed on any of an unprocessed surface, a polished surface, and a cutting edge processed surface of the base material after sintering.

(B) Modified Layer of Cemented Carbide Base Material

In a case where the base material is a cemented carbide, it is preferable to form a modified layer having an fcc structure with an average thickness of 1 to 10 nm by irradiating the surface of the base material with ions generated from a TiB alloy target (hereinafter, also referred to as ion bombardment). While tungsten carbide as the primary component of the cemented carbide has an hcp structure, the modified layer has the same fcc structure as the base material side single layer portion. The base material of cemented carbide and the modified layer are continuous at the boundary (interface) therebetween with preferably 30% or more, more preferably 50% or more, and particularly preferably 70% or more of the crystal lattice fringes. With this structure, the base material of cemented carbide and the base material side single layer portion are firmly adhered to each other via the modified layer.

In the case of the coated cutting tool having the modified layer, the modified layer having the fcc structure is formed into a high-density thin layer and is thus less likely to be the origin of fracture. When the average thickness of the modified layer is less than 1 nm, the effect of improving the adhesion of the hard coating to the base material cannot be sufficiently obtained, and when the average thickness of the modified layer exceeds 10 nm, the adhesion is deteriorated. The average thickness of the modified layer is more preferably 2 to 9 nm.

(C) Hard Coating (1) Composition (a) Base Material Side Single Layer Portion and Surface Side Single Layer Portion Both the base material side single layer portion and the surface side single layer portion of the present embodiment are formed of a nitride-based hard coating in which the proportion of Al is highest in the ratio of metal (including metalloid) elements, the sum of Al and Cr in a content ratio (atomic ratio) is 0.9 or more, and at least B is contained. By causing the content ratio (atomic ratio) of the sum of Al and Cr to be 0.9 or more, the wear resistance of the coating is improved. In order to improve the wear resistance of the coating, the content ratio (atomic ratio) of the sum of Al and Cr is preferably 0.90 to 0.99, the content ratio (atomic ratio) of Al is 0.5 or more, and the content ratio (atomic ratio) of B is preferably 0.01 or more. When the content ratio (atomic ratio) of the sum of Al and Cr, the content ratio (atomic ratio) of Al, and the content ratio (atomic ratio) of B deviate from the specific ranges, the wear resistance decreases. Here, "nitride-based" means that the content ratio (atomic ratio) of N is 0.5 or more with respect to the sum of the content ratios (atomic ratios) of nonmetal elements being 1, and the content ratio (atomic ratio) of N is preferably 0.6 or more.

In a case where the base material side single layer portion and the surface side single layer portion are (AlCrB)N coatings, (AlCrB)NO coatings, or (AlCrB)NCO coatings, the composition of the coatings is preferably represented by the following general formula, excluding unavoidable impurities: $(Al_xCr_{1-x-y}B_{1-e-f}C_eO_f$ (here, x, 1-x-y, y, 1-e-f, e, and f are numbers that respectively represent the atomic ratios of Al, Cr, B, N, C, and O, and satisfy $0.5 \leq x \leq 0.75$, $0.01 \leq y \leq 0.1$, $0 \leq e \leq 0.03$, and $0 \leq f \leq 0.010$). The contents of metal (including metalloid elements) elements, N, and O can be analyzed by using EPMA and TEM-EDS (hereinafter also referred to as EDS described later in combination. The C content can be analyzed by EPMA described later.

The range of the atomic ratio x of Al is preferably 0.5 to 0.75. When x is less than 0.5, the Al content is too small, and the oxidation resistance of the coating is impaired. On the other hand, when x exceeds 0.75, a crystal phase having a soft hcp structure is formed in the coating, and wear resistance is impaired. x is more preferably 0.50 to 0.74.

The range of the atomic ratio 1-x-y of Cr is preferably 0.49 to 0.15. When 1-x-y is less than 0.15, the Al content is too large, so that a crystal phase having a soft hcp structure is formed in the coating and wear resistance is impaired. On the other hand, when 1-x-y exceeds 0.49, the Al content in the coating becomes too small, and the oxidation resistance is impaired. 1-x-y is more preferably 0.49 to 0.18.

The range of the atomic ratio y of B is preferably 0.01 to 0.1. When y is less than 0.01, the effect of the addition of B cannot be obtained, and the lubricity of the coating is impaired. On the other hand, when y exceeds 0.1, the coating becomes brittle. y is more preferably 0.01 to 0.08.

The atomic ratio 1-e-f of N contained in the (AlCrB)N coating, the (AlCrB)NO coating, and the (AlCrB)NCO coating of the present embodiment is preferably 1 to 0.96.

When 1-e-f deviates from the specific range, the wear resistance of the coating is likely to decrease. 1-e-f is more preferably 0.998 to 0.96.

The atomic ratio f of O contained in each of the (AlCrB)N coating, the (AlCrB)NO coating, and the (AlCrB)NCO coating of the present embodiment is preferably 0.010 or less. When f exceeds 0.010, the oxygen content becomes excessive, and the wear resistance of the coating is likely to decrease. f is more preferably 0.002 to 0.010.

The atomic ratio e of C contained in the (AlCrB)NCO coating of the present embodiment is preferably 0.03 or less. When e exceeds 0.03, the wear resistance of the coating decreases. In order to improve the wear resistance of the coating, e is more preferably 0.01 to 0.03. In the case of the (AlCrB)N coating and (AlCrB)NO coating described above, e is allowed to have an unavoidable impurity level of less than 0.01 (for example, about 0.001 to 0.009).

(b) Laminated Portion

In the laminated portion of the present embodiment, the nitride-based a layer in which the proportion of Ti is highest in the ratio of metal (including metalloid) elements and at least B is contained, and the nitride-based b layer in which the proportion of Al is highest in the ratio of metal (including metalloid) elements and at least Cr and B are contained are alternately laminated. In the a layer, the content ratio (atomic ratio) of Ti is preferably 0.65 or more, and the content ratio (atomic ratio) of B is preferably 0.01 or more. In the b layer, the content ratio (atomic ratio) Al is preferably 0.42 or more, the content ratio (atomic ratio) of Cr is preferably 0.1 or more, and the content ratio (atomic ratio) of B is preferably 0.01 or more. When the content ratio (atomic ratio) of each element in the a layer and the b layer deviates from the specific range, the wear resistance of the coating is likely to decrease. Here, "nitride-based" means that the content ratio (atomic ratio) of N is 0.5 or more with respect to the sum of the content ratios (atomic ratios) of nonmetal elements being 1, and the content ratio (atomic ratio) of N is preferably 0.6 or more.

The composition of the metal (including metalloid) elements of the a layer is preferably represented by the following general formula, excluding unavoidable impurities: $(Ti_{1-p-q-r}B_pAl_qCr_r)$ (here, 1-p-q-r, p, q, and r are numbers that respectively represent the atomic ratios of Ti, B, Al, and Cr, and satisfy $0.01 \leq p \leq 0.05$, $0.02 \leq q \leq 0.2$, and $0.01 \leq r \leq 0.1$).

The atomic ratio 1-p-q-r of Ti is preferably 0.96 to 0.65. When 1-p-q-r deviates from the above specific range, the rake face wear resistance of the coating decreases. 1-p-q-r is more preferably 0.96 to 0.8.

The atomic ratio p of B is preferably 0.01 to 0.05. When p deviates from the specific range, the rake face wear resistance of the coating decreases. p is more preferably 0.01 to 0.03.

The atomic ratio q of Al is preferably 0.02 to 0.2. When q deviates from the specific range, the rake face wear resistance of the coating decreases. q is more preferably 0.02 to 0.12.

The atomic ratio r of Cr is preferably 0.01 to 0.1. When r deviates from the specific range, the rake face wear resistance of the coating decreases. r is more preferably 0.01 to 0.05.

The composition of the metal (including metalloid) elements of the b layer is preferably represented by the following general formula, excluding unavoidable impurities: $(Al_{1-s-t-u}Cr_sB_tTi_u)$ (here, 1-s-t-u, s, t, and u are numbers that respectively represent the atomic ratios of Al, Cr, B, and Ti, and satisfy $0.1 \leq s \leq 0.4$, $0.01 \leq t \leq 0.08$, and $0.03 \leq u \leq 0.1$).

The atomic ratio 1-s-t-u of Al is preferably 0.86 to 0.42. When 1-s-t-u deviates from the specific range, the flank face wear resistance of the coating decreases. 1-p-q-r is more preferably 0.84 to 0.44.

The atomic ratio s of Cr is preferably 0.1 to 0.4. When s deviates from the specific range, the flank face wear resistance of the coating decreases. s is more preferably 0.12 to 0.40.

The atomic ratio t of B is preferably 0.01 to 0.08. When t deviates from the specific range, the flank face wear resistance of the coating decreases. t is more preferably 0.01 to 0.07.

The atomic ratio u of Ti is preferably 0.03 to 0.1. When u deviates from the specific range, the flank face wear resistance of the coating decreases. u is more preferably 0.03 to 0.09.

Both the a layer and the b layer are nitride-based hard coatings. When nonmetal elements (N, C, and O) of the a layer and the b layer was subjected to EDS analysis, although the inclusion of C was confirmed by qualitative analysis, the measurement result of the C content was not stable, and accurate quantitative analysis of C could not be performed. However, it was found that N was primarily contained regarding the content ratios (atomic ratios) of N, C, and O in the a layer and the b layer. That is, in the a layer and the b layer, the content ratio (atomic ratio) of N is 0.5 or more with respect to the sum of the content ratios (atomic ratios) of N, C, and O being 1, and in a preferable example, the content ratio (atomic ratio) of N was 0.6 or more. Therefore, in Tables 5 and 6 described later, the compositions of both the a layer and the b layer are shown only by the composition of metal (including metalloid) elements.

(c) Effect of Addition of B to Hard Coating

By setting the B content to be in the specific range in the base material side single layer portion, the a layer and the b layer of the laminated portion, and the surface side single layer portion, the lattice strain of the crystal grains of each coating increases. By this action, in the hard coating to which B is added, the coating hardness, wear resistance, and tool life are all improved.

(d) Effect of Addition of C to Hard Coating

On the assumption that the B content is set to be in the specific range, by setting the C content to be in the specific range in the base material side single layer portion, the a layer and the b layer of the laminated portion, and the surface side single layer portion, the lattice strain of the crystal grains of each coating further increases. By this action, in the hard coating to which C is added, the coating hardness, wear resistance, and tool life are all further improved.

(2) Coating Thickness

The coating thickness (t1) of the base material side single layer portion of the present embodiment is larger than the coating thickness (t2) of the entirety of the laminated portion. Furthermore, t1 is preferably 1.0 to 5 μm. When t1 is less than 1.0 μm, flank face wear tends to proceed, and when t1 exceeds 5 μm, the adhesion of the base material side single layer portion significantly decreases. t1 is more preferably 1.2 to 5.0 μm.

The coating thickness (t2) of the entirety of the laminated portion is preferably 0.5 to 2.5 μm. When t2 is less than 0.5 μm, rake face wear tends to proceed, and when t2 exceeds 2.5 μm, the adhesion of the laminated portion decreases. t2 is more preferably 0.8 to 2.2 μm.

The coating thickness (t3) of the surface side single layer portion of the present embodiment is preferably 0.3 to 5 μm. When t3 is less than 0.3 μm, the effect of suppressing flank face wear cannot be obtained, and when t3 exceeds 5 µm, the adhesion between the surface side single layer portion 35 and the laminated portion 34 significantly decreases. t3 is more preferably 0.5 to 4.5 µm.

The coating thickness ratio (t1/t2) of the base material side single layer portion to the entirety of the laminated portion of the present embodiment is preferably 1.0 to 5. The coating thickness ratio (t3/t2) of the surface side single layer portion to the entirety of the laminated portion in the present embodiment is preferably 0.3 to 4. The ratio (t1+t3)/t2 of the sum of the coating thicknesses of the base material side single layer portion and the surface side single layer portion of the present embodiment to the coating thickness of the entirety of the laminated portion is preferably 1.0 to 10. When the coating thickness ratios t1/t2, t3/t2, and (t1+t3)/t2 deviate from the specific ranges, it becomes difficult to achieve both excellent flank face wear resistance and rake face wear resistance. t1/t2 is more preferably 1.2 to 5. t3/t2 is more preferably 0.5 to 3. (t1+t3)/t2 is more preferably 1.2 to 8.

Although not particularly limited, both the coating thickness (ta) of the a layer and the coating thickness (tb) of the b layer constituting the laminated portion of the present embodiment are preferably 3 to 30 nm. When ta and tb deviate from the above specific ranges, it becomes difficult to achieve both excellent flank face wear resistance and rake face wear resistance. It is more preferable that both ta and tb are 4 to 28 nm.

The coating thickness ratio (t3/t1) of the surface side single layer portion to the base material side single layer portion is preferably 0.1 to 1.5. When t3/t1 deviates from the above specific range, it becomes difficult to achieve both excellent flank face wear resistance and rake face wear resistance. t3/t1 is more preferably 0.2 to 1.2.

The "coating thicknesses" of the base material side single layer portion, the laminated portion, and the surface side single layer portion, which are not flat, mean "arithmetic average thicknesses".

(3) Lamination Period of Laminated Portion

As illustrated in FIG. 2, the lamination period T of the a layer and the b layer of the laminated portion of the present embodiment is the distance (thickness) in the coating thickness direction from the lower end of any one a layer to the upper end of the immediately adjacent one b layer. T is 5 to 100 nm. When T is less than 5 nm or more than 100 nm, the wear resistance of the coating decreases in either case. T is preferably 10 to 90 nm, and more preferably 20 to 80 nm.

There are cases where in the laminated portion, the boundary between the a layer and the b layer is unclear due to the interdiffusion of the a layer and the b layer. In this case, the lamination period T can also be measured as the distance in the lamination direction between two a layers disposed with the b layer interposed therebetween in three adjacent layers (for example, the a layer, the b layer, and the a layer sequentially laminated) in the laminated portion. The distance between the two a layers is the distance connecting the midpoints of the respective a layers in the thickness direction.

(4) Crystal Structure

The X-ray diffraction pattern of a portion of the hard coating formed of the base material side single layer portion and the laminated portion of the present embodiment has a single fcc structure. Furthermore, it is preferable that the X-ray diffraction pattern of a portion of the hard coating formed of the base material side single layer portion, the laminated portion, and the surface side single layer portion of the present embodiment has a single fcc structure. That is, the portion of the hard coating of the present embodiment has a fcc crystalline phase and thus contributes to high performance and long life of the coated cutting tool. In the hard coating, a small amount of a phase other than fcc may be present as long as the phase in a range not appearing in the X-ray diffraction pattern. The crystal structure of only the laminated portion can be identified by electron diffraction (TEM) by which a small amount of the phase can be detected. From the viewpoint of high performance and long life, in the electron diffraction, the laminated portion preferably has fcc as a main structure, and more preferably has a single fcc structure.

It is preferable that the ratio I(200)/I(111) of an X-ray diffraction peak value I(200) of a (200) plane to an X-ray diffraction peak value I(111) of a (111) plane in the X-ray diffraction pattern is 0.2 to 0.37. When the ratio I(200)/I(111) deviates from the above specific range, it becomes difficult to suppress flank face wear and rake face wear in a well-balanced manner. The ratio I(200)/I(111) is more preferably 0.25 to 0.36.

It is preferable that the ratio I(311)/I(111) of an X-ray diffraction peak value I(311) of a (311) plane to the X-ray diffraction peak value I(111) of the (111) plane in the X-ray diffraction pattern is 0.03 to 0.15. When the ratio I(311)/I(111) deviates from the above specific range, it becomes difficult to suppress flank face wear and rake face wear in a well-balanced manner. The ratio I(311)/I(111) is more preferably 0.06 to 0.12.

(D) Mechanism

The present inventors intensively studied a nanolayered coating having high performance and a long life, and as a result, discovered that flank face wear and rake face wear can be significantly suppressed in a well-balanced manner compared to the related art by (i) forming a base material side single layer portion having the above-described specific composition on a base material, (ii) alternately laminating an a layer and a b layer having the above-described specific compositions on the base material side single layer portion and causing the lamination period T in the coating thickness direction of both the layers to be 5 to 100 nm, and (iii) causing an X-ray diffraction pattern of a portion formed of the base material side single layer portion and a laminated portion to have a single fcc structure. That is, although not sufficiently clarified, it was found that the base material side single layer portion and the b layer mainly suppress flank face wear, and the a layer mainly suppresses rake face wear (crater wear). Furthermore, it was found that the effect of suppressing flank face wear is further improved when the surface side single layer portion is formed.

In addition, as described above, it was found that in a case where the ratio I(200)/I(111) is 0.2 to 0.37, flank face wear and rake face wear can be suppressed in a well-balanced manner. It is considered that the coated cutting tool of the present embodiment achieves high performance and a long life because (200) plane orientation is relatively suppressed and (111) plane orientation is increased in polycrystalline grains of the coatings constituting the base material side single layer portion and the laminated portion, and further the surface side single layer portion.

It was found that on the assumption that the ratio I(200)/I(111) is 0.2 to 0.37, in a case where the ratio I(311)/I(111) is 0.03 to 0.15, flank face wear and rake face wear can be further suppressed in a well-balanced manner. It is considered that the coated cutting tool of the present embodiment achieves high performance and a long life because (311) plane orientation is relatively suppressed and (111) plane orientation is increased in polycrystalline grains of the coatings constituting the base material side single layer portion and the laminated portion, and further the surface side single layer portion.

[2] Coating Forming Apparatus

Figure 1:
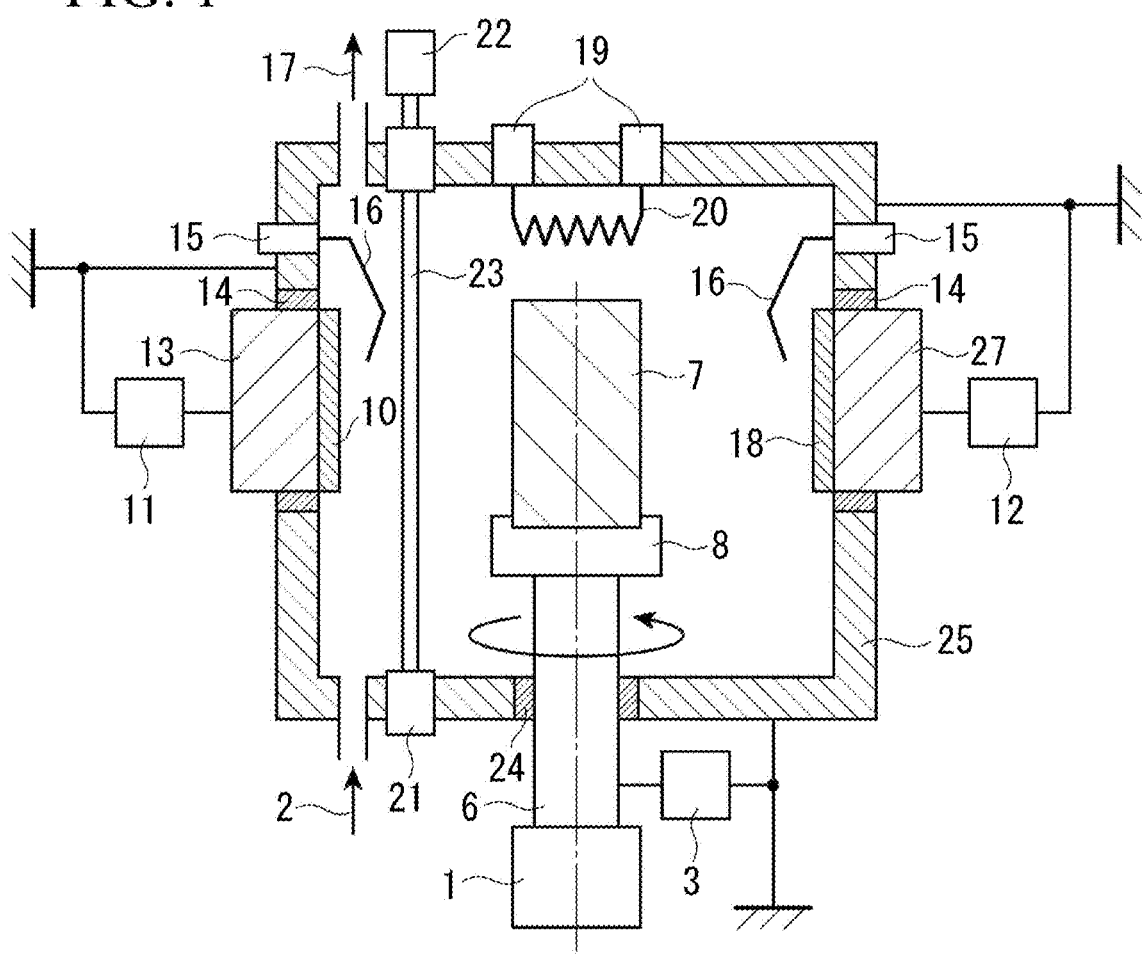
FIG. 1 is a front view illustrating an example of an arc ion plating apparatus that can be used for forming a hard coating of a coated cutting tool of the present invention.

An arc ion plating (hereinafter, also referred to as AI) apparatus can be used for forming the hard coating of the present embodiment. For example, as illustrated in FIG. 1, the AI apparatus includes a decompression container 25, arc discharge evaporation sources 13 and 27 attached to the decompression container 25 via insulators 14, targets 10 and 18 respectively attached to the arc discharge evaporation sources 13 and 27, arc discharge power supplies 11 and 12 respectively connected to the arc discharge evaporation sources 13 and 27, a rotatable support 6 that penetrates through a bearing portion 24 to the inside of the decompression container 25, a holder 8 supported by the support 6 for holding a base material 7, a drive unit 1 that rotates the support 6, and a bias power supply 3 that applies a bias voltage to the base material 7. The decompression container 25 is provided with a gas introduction portion 2 and an exhaust port 17. Arc ignition mechanisms 16 and 16 are attached to the decompression container 25 via arc ignition mechanism bearing portions 15 and 15. To ionize the gas (argon gas, nitrogen gas, or the like) introduced into the decompression container 25, a filament type electrode 20 is attached to the decompression container 25 via insulators 19 and 19. A shield plate 23 is provided on the decompression container 25 via a shield plate bearing portion 21 between the target 10 and the base material 7 in. The shield plate 23 is moved, for example, in a vertical or horizontal direction by a shield plate drive unit 22, and after the shield plate 23 is made not to exist between the target 10 and the base material 7, the formation of the hard coating of the present embodiment is performed.

(A) Target for Forming Base Material Side Single Layer Portion and Surface Side Single Layer Portion (1) Composition of AlCrB Alloy and AlCrBC Alloy The AlCrB alloy or AlCrBC alloy used as a target for forming the base material side single layer portion, the b layer, and the surface side single layer portion (hereinafter, also referred to as the base material side single layer portion and the like) of the present embodiment is obtained, for example, by using Al powder or AlC powder and CrB alloy powder with a predetermined composition, blending and mixing the powders in the following composition of AlCrB alloy or AlCrBC alloy, forming the obtained mixed powder, and sintering the obtained formed body. The amount of oxygen contained in the AlCrB sintered body alloy or AlCrBC sintered body alloy produced by the above-mentioned step can be appropriately adjusted from the particle size of the Al powder or AlC powder and CrB alloy powder, and by performing the steps from the blending step to the sintering step in a non-oxidizing atmosphere (for example, an argon gas atmosphere or an atmosphere having a vacuum degree of 1 to $10 \times 10^{-3}$ Pa).

It is preferable that the AlCrB alloy or AlCrBC alloy has a composition represented by the following general formula, excluding unavoidable impurities: $Al_\alpha Cr_{1-\alpha-\beta-\gamma} B_\beta C_\gamma$ (here, $\alpha$, $1-\alpha-\beta-\gamma$, $\beta$, and $\gamma$ are numbers that respectively represent the atomic ratios of Al, Cr, B, and C, and satisfy $0.4 \leq \alpha \leq 0.8$, $0.04 \leq \beta \leq 0.165$, and $0 \leq \gamma \leq 0.035$). By setting each of $\alpha$, $\beta$, and $\gamma$ to be in the above-mentioned specific range, the base material side single layer portion and the like of the present embodiment can be formed.

The range of the atomic ratio $\alpha$ of Al is preferably 0.4 to 0.8. When $\alpha$ is less than 0.4, the Al content of the base material side single layer portion and the like is too small, and thus the oxidation resistance of the base material side single layer portion and the like is impaired. On the other hand, when $\alpha$ exceeds 0.8, a crystal phase having a soft hcp structured is formed in the base material side single layer portion and the like, and the wear resistance is impaired. The range of $\alpha$ is more preferably 0.45 to 0.78.

The range of the atomic ratio $1-\alpha-\beta-\gamma$ of Cr is preferably 0.56 or less. When $1-\alpha-\beta-\gamma$ exceeds 0.56, the Al content of the base material side single layer portion and the like becomes too small and the oxidation resistance is impaired. The range of $1\alpha-\beta-\gamma$ is more preferably 0.485 to 0.025.

The range of the atomic ratio $\beta$ of B is preferably 0.04 to 0.165. When $\beta$ is less than 0.04, the effect of addition of B cannot be obtained. On the other hand, when $\beta$ exceeds 0.165, the base material side single layer portion and the like cannot hold the single fcc structure in the X-ray diffraction pattern. The range of $\beta$ is more preferably 0.05 to 0.16.

The atomic ratio $\gamma$ of C is preferably 0.035 or less. When $\gamma$ exceeds 0.035, the coated cutting tool has a short life. The range of $\gamma$ is more preferably 0.015 to 0.035.

(2) Oxygen Content of AlCrB alloy or AlCrBC alloy

The oxygen content of the AlCrB alloy or AlCrBC alloy is preferably 2000 to 4000 µg/g. When the oxygen content is less than 2000 µg/g or more than 4000 µg/g, the atomic ratio f of O of the base material side single layer portion and the like is less than 0.002 or more than 0.010. The oxygen content of the AlCrB alloy or AlCrBC alloy is more preferably 2050 to 3900 µg/g, and particularly preferably 2100 to 3800 µg/g.

(B) TiB Alloy Target

It is preferable that a TiB alloy target for forming the modified layer and the a layer of the present embodiment has a composition represented by the following general formula, excluding unavoidable impurities: $Ti_{1-\delta} B_\delta$ (here, $1-\delta$ and $\delta$ are numbers that respectively represent the atomic ratios of Ti and B, and satisfy $0.1 \leq \delta \leq 0.5$). When $\delta$ is less than 0.1, a decarburized layer is formed and a modified layer having an fcc structure cannot be obtained. When $\delta$ exceeds 0.5, the modified layer having the fcc structure cannot be obtained. $\delta$ is more preferably 0.10 to 0.3.

(C) Arc Discharge Evaporation Source and Arc Discharge Power Supply

As shown in FIG. 1, the arc discharge evaporation sources 13 and 27 are respectively provided with the target 10 made of the TiB alloy for forming the modified layer or the a layer, and the target 18 made of the AlCrB alloy or AlCrBC alloy for forming the base material side single layer portion and the like. For example, a DC current or a pulsed current is applied to the target 10 or the target 18 as an arc current. Although not illustrated, it is preferable that the arc discharge evaporation sources 13 and 27 are provided with magnetic field generating means (a structure including an electromagnet and/or a permanent magnet and a yoke) to form a magnetic field distribution of several tens of G (for example, 10 to 50 G) in the vicinity of the base material 7.

Droplets generated during the formation of the hard coating of the present embodiment act as the origin of fracture of the hard coating. Therefore, it is preferable that a DC arc current of 150 to 250 A is applied the target 18 made of the AlCrB alloy or AlCrBC alloy and the target 10 made of the TiB alloy to suppress excessive generation of droplets.

(D) Bias Power Supply

As illustrated in FIG. 1, a bias voltage is applied to the base material 7 from the bias power supply 3.

[3] Coating Formation Conditions

The ion bombardment conditions and the hard coating formation conditions of the present embodiment will be described below in detail for each step, but are not particularly limited.

(A) Base Material Cleaning Step

After the base material 7 is set on the holder 8 of the AI apparatus illustrated in FIG. 1, the base material 7 is heated to a temperature of 250° C. to 650° C. by a heater (not illustrated) while holding the inside of the decompression container 25 at 1 to $5 \times 10^{-2}$ Pa (for example, $1.5 \times 10^{-2}$ Pa). Although the base material 7 is shown as a cylindrical body in FIG. 1, the base material 7 can take various shapes such as a solid type end mill or insert. The base material 7 is made of, for example, a WC-based cemented carbide. After heating the base material 7 to raise the temperature, argon gas is introduced into the decompression container 25 to achieve an argon gas atmosphere of 0.5 to 10 Pa (for example, 2 Pa). In this state, a DC bias voltage or a pulsed bias voltage of −250 to −150 V is applied to the base material 7 by the bias power supply 3 such that the surface of the base material 7 is bombarded with argon ions and cleaned.

When the temperature of the base material is lower than 250° C., there is no etching effect by argon ions, and when the temperature of the base material exceeds 650° C., it is difficult to set the temperature of the base material to a predetermined condition during the coating forming step. The temperature of the base material is measured by a thermocouple embedded in the base material (the same applies to the subsequent steps). When the pressure of the argon gas in the decompression container 25 is out of the range of 0.5 to 10 Pa, the bombarding treatment with argon ions becomes unstable. When the DC bias voltage or the pulsed bias voltage is less than −250 V, arcing occurs in the base material, and when the DC bias voltage or the pulsed bias voltage exceeds −150 V, the cleaning effect by the bombarding etching cannot be sufficiently obtained.

(B) Modified Layer Forming Step

The formation of the modified layer on the base material 7 is performed by ion bombardment on the base material 7 using the TiB alloy target 10. After cleaning the base material 7, the inside of the decompression container 25 is set to an argon gas atmosphere with a flow rate of 30 to 150 sccm. An arc current (DC current) of 50 to 100 A is applied from the arc discharge power supply 11 to the surface of the TiB alloy target 10 attached to the arc discharge evaporation source 13. The base material 7 is heated to a temperature of 450 to 750° C., and the bias power supply 3 applies a DC bias voltage of −1000 to −600 V to the base material 7. The base material 7 is irradiated with Ti ions and B ions by the ion bombardment using the TiB alloy target 10.

When the temperature of the base material 7 is out of the range of 450° C. to 750° C., the modified layer having the fcc structure is not formed, or a decarburized layer is formed on the surface of the base material 7, so that the adhesion to the base material side single layer portion is significantly decreased. When the flow rate of the argon gas in the decompression container 25 is less than 30 sccm, the energy of Ti ions and the like incident on the base material 7 is too strong and a decarburized layer is formed on the surface of the base material 7, so that the adhesion to the base material side single layer portion is impaired. On the other hand, when the flow rate of the argon gas exceeds 150 sccm, the energy of Ti ions and the like is weakened and the modified layer is not formed.

When the arc current is less than 50 A, the arc discharge becomes unstable, and when the arc current exceeds 100 A, a large number of droplets are formed on the surface of the base material 7 and the adhesion to the base material side single layer portion is impaired. When the DC bias voltage is less than −1000 V, the energy of Ti ions and the like is too strong and a decarburized layer is formed on the surface of the base material 7, and when the DC bias voltage exceeds −600 V, the modified layer is not formed on the surface of the base material.

(C) Hard Coating Forming Step (1) Coating Formation of Base Material Side Single Layer Portion The base material side single layer portion of the present embodiment is formed on the base material 7 or, in a case where the modified layer is formed, on the modified layer. At this time, nitrogen gas is used to apply an arc current from the arc discharge power supply 12 to the surface of the target 18 made of the AlCrB alloy or AlCrBC alloy attached to the arc discharge evaporation source 27. At the same time, a DC bias voltage or a unipolar pulsed bias voltage is applied from the bias power supply 3 to the base material 7 controlled to the temperature below.

(a) Temperature of Base Material

The temperature of the base material during coating formation of the base material side single layer portion of the present embodiment is set to 400° C. to 550° C. When the temperature of the base material is lower than 400° C., the base material side single layer portion is not sufficiently crystallized, so that the base material side single layer portion does not have sufficient lubricity and wear resistance. In addition, the increase in the residual stress causes peeling of the coating. On the other hand, when the temperature of the base material is higher than 550° C., the refinement of the crystal grains of the base material side single layer portion is excessively promoted, and the lubricity and wear resistance are impaired. The temperature of the base material is preferably 480° C. to 540° C.

(b) Pressure of Nitrogen Gas

Nitrogen gas is used as a coating forming gas for the base material side single layer portion of the present embodiment. The pressure (total pressure) of nitrogen gas is 2.7 to 3.3 Pa. When the pressure of the nitrogen gas is less than 2.7 Pa, the nitriding of the base material side single layer portion is insufficient, and a reduction in the life of the coated cutting tool is caused due to the presence of a different phase that is not nitrided, and the oxygen content of the base material side single layer portion becomes excessive. On the other hand, when the pressure of the nitrogen gas exceeds 3.3 Pa, the oxygen content of the base material side single layer portion becomes too small, which causes softening. The pressure of the nitrogen gas is preferably 2.8 to 3.2 Pa, and more preferably 2.9 to 3.1 Pa.

(c) Flow Rate of Nitrogen Gas

The flow rate of nitrogen gas is preferably 750 to 900 sccm. When the flow rate of nitrogen gas is less than 750 sccm and more than 900 sccm, in either case, it becomes difficult to adjust the pressure (total pressure) of the nitrogen gas to 2.7 to 3.3 Pa. The flow rate of nitrogen gas is more preferably 770 to 880 sccm.

(d) Bias Voltage Applied to Base Material

In order to form the base material side single layer portion of the present embodiment, it is preferable to apply a DC or unipolar pulsed bias voltage to the base material. The bias voltage is preferably set to −160 to −100 V. When the bias voltage is less than −160 V, the B content is significantly reduced. On the other hand, when the bias voltage exceeds −100 V, the coated cutting tool has a short life. The bias voltage is more preferably set to −150 to −110 V.

In the case of the unipolar pulsed bias voltage, the bias voltage means a negative peak value excluding a steep rising portion from zero to the negative side. The frequency of the unipolar pulsed bias voltage is preferably 20 to 50 kHz, and more preferably 30 to 40 kHz.

(e) Arc Current

In order to suppress droplets during the coating formation of the base material side single layer portion, the arc current (DC current) applied to the target 18 is preferably set to 150 to 250 A. When the arc current is less than 150 A, the arc discharge becomes unstable, and when the arc current exceeds 250 A, the droplets significantly increase and the wear resistance of the base material side single layer portion deteriorates. The arc current is more preferably set to 160 to 240 A.

(2) Coating Formation of Laminated Portion

The laminated portion of the present embodiment is formed on the base material side single layer portion. The laminated portion may be the outermost layer. Specifically, the laminated portion of the present embodiment in which the a layer and the b layer are alternately deposited is formed by applying an arc current to the target 10 (TiB alloy) in addition to the target 18 (AlCrB alloy or AlCrBC alloy) while continuing the coating formation of the base material side single layer portion. The coating formation conditions peculiar to the laminated portion are only the following (i) and (ii), and the other conditions are the same as the coating formation conditions for the base material side single layer portion.

(i) The bias voltage applied to the base material is preferably set to −140 to −80 V. By shifting the bias voltage applied to the base material during the coating formation of the laminated portion to a positive voltage side from the bias voltage of the base material side single layer portion (this shift is preferably 5 to 30 V), the composition of the b layer of the laminated portion is richer in Al than the compositions of the base material side single layer portion and the surface side single layer portion. With this structure, a high performance and long life coated cutting tool can be obtained. When the bias voltage is less than −140 V, the B content is significantly reduced, and when the bias voltage exceeds −80 V, the coated cutting tool has a short life. A more preferable range of the bias voltage is −130 to −90 V.

(ii) It is practical to apply an arc current to the target 18 and the target 10 at the same time during the coating formation of the laminated portion.

(3) Coating Formation of Surface Side Single Layer Portion

The surface side single layer portion of the present embodiment is formed on the laminated portion, as necessary. For example, it is preferable that the coating thickness ratio t3/t1 of the surface side single layer portion to the base material side single layer portion is set to 0.1 to 1.5 by adjusting the coating formation time. The other conditions are the same as the coating formation conditions for the base material side single layer portion.

(4) Upper Layer of Laminated Portion or Surface Side Single Layer Portion

The laminated portion or the surface side single layer portion may be the outermost layer, but as necessary, at least one known hard coating may be provided on the laminated portion or the surface side single layer portion. As a known hard coating, for example, at least one hard coating selected from the group consisting of (TiAl)N, (TiAlCr)N, (TiAlNb)N, (TiAlW)N, (TiSi)N, (TiB)N, TiCN, $Al_2O_3$, $Cr_2O_3$, (AlCr)N, and (AlCrSi)N is exemplified.

EXAMPLES

The present invention will be described in more detail with reference to the following examples, but the present invention is not limited thereto. In the following examples and comparative examples, the compositions of metal elements and metalloid elements of targets are values measured by a fluorescent X-ray method unless otherwise specified, and the oxygen content is a value measured by a carrier gas hot extraction method. In addition, although inserts were used as the base material of the hard coating in the examples, the present invention is not limited thereto, and can be applied to cutting tools (end mills, drills, and the like) other than inserts.

Example 1

(1) Cleaning of Base Material

Figure 13:
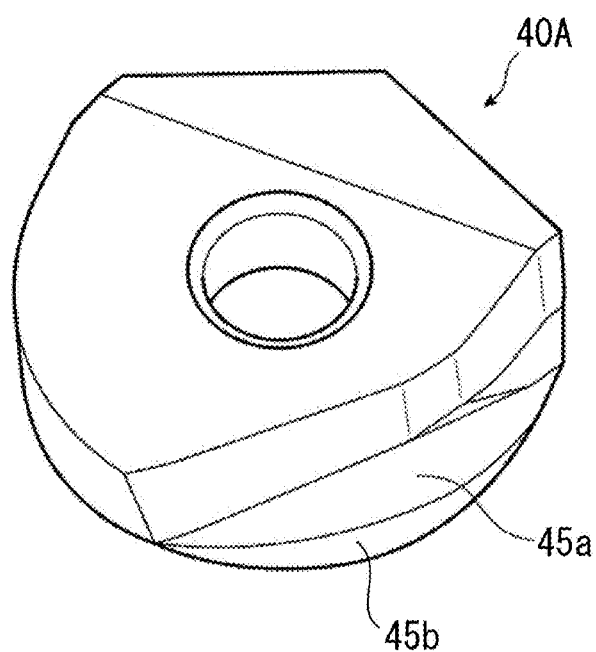
FIG. 13 is a perspective view illustrating an example of an insert base material constituting the coated cutting tool of the present invention.

A finishing milling insert base material (ZDFG300-SC manufactured by Mitsubishi Hitachi Tool Engineering, Ltd. illustrated in FIG. 13) made of WC-based cemented carbide containing 8.0% by mass of Co and the remainder consisting of WC and unavoidable impurities, and an insert base material (SNMN120408 manufactured by Mitsubishi Hitachi Tool Engineering, Ltd.) for measuring physical properties were set on the holder 8 of the AI apparatus illustrated in FIG. 1 and heated to 550° C. by the heater (not illustrated) simultaneously with evacuation. Thereafter, argon gas was introduced at a flow rate of 500 sccm (sccm is cc/min at 1 atm and 25° C. and the same is applied hereinafter) to adjust the pressure in the decompression container 25 to 2.0 Pa, a DC bias voltage of −200 V was applied to each of the base materials (hereinafter, also referred to as the base material 7) to clean the base material 7 by etching with argon ion bombardment.

(2) Formation of Modified Layer Using TiB Alloy Target

While maintaining the temperature of the base material at 550° C., the flow rate of the argon gas was set to 70 sccm, and the TiB alloy target 10 having the composition represented by $Ti_{0.85}B_{0.15}$ (atomic ratio) was disposed on the arc discharge evaporation source 13 to which the arc discharge power supply 11 was connected. A DC voltage of −800 V was applied to the base material 7 by the bias power supply 3, and an arc current (DC current) of 75 A was caused to flow through the surface of the target 10 from the arc discharge power supply 11 to form a modified layer having an average thickness of 5 nm on the surface of the base material 7. The average thickness of the modified layer was measured by the method described in Japanese Patent No. 5967329.

(3) Formation of Base Material Side Single Layer Portion

The target 18 made of the AlCrB sintered body alloy having the composition of metal elements and metalloid elements of $Al_{0.55}Cr_{0.35}B_{0.10}$ (atomic ratio) and having an oxygen content of 2300 μg/g was disposed on the arc discharge evaporation source 27 to which the arc discharge power supply 12 in FIG. 1 was connected. The temperature of the base material 7 was set to 450° C., the total pressure of the nitrogen gas in the decompression container 25 in the nitrogen gas atmosphere was set to 3.0 Pa, and the flow rate of the nitrogen gas was adjusted to 800 sccm.

A DC voltage of −140 V was applied to the base material 7 by the bias power supply 3, and a DC arc current of 200 A was applied to the target 18 from the arc discharge power supply 12 to form a base material side single layer portion having a composition of $Al_{0.60}Cr_{0.38}B_{0.02})N_{0.994}O_{0.006}$ (atomic ratio) and a coating thickness (t1) of 2.0 μm on the base material 7 as the base material side single layer portion.

(4) Formation of Laminated Portion

A DC arc current of 200 A was caused to flow to the TiB alloy target 10 having a composition represented by $Ti_{0.85}B_{0.15}$ (atomic ratio) from the arc discharge power supply 11 while maintaining the coating formation conditions of the base material side single layer portion except that a DC voltage of −120 V was applied to the base material 7 by the bias power supply 3, and 50 a layers and 50 b layers were alternately deposited on the base material side single layer portion to form a laminated portion having an overall coating thickness (t2) of 1.0 µm. Thus, the coated cutting tool (milling insert) of the present example was produced.

(5) Observation of Cross-Sectional Structure of Hard Coating

Figure 3:
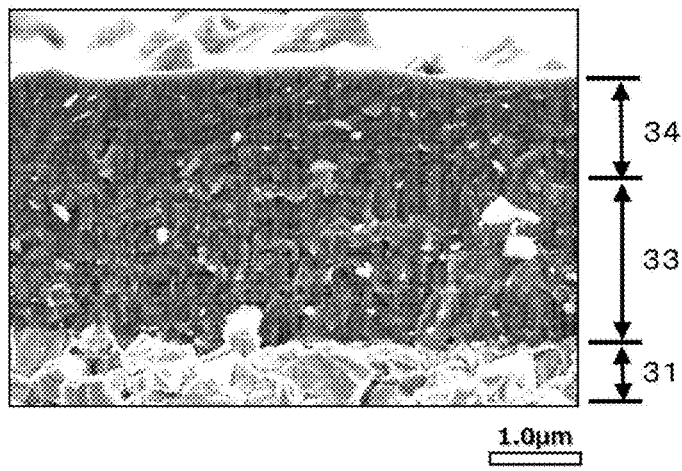
FIG. 3 is a scanning electron microscope (SEM) photograph (magnification: 20,000 times) showing a cross section of a coated cutting tool of Example 1.

FIG. 3 is a scanning electron microscope (SEM) photograph (magnification: 20,000 times) showing a cross-sectional structure of the coated cutting tool. In FIG. 3, 31 denotes a WC-based cemented carbide base material, 33 denotes a base material side single layer portion, and 34 denotes a laminated portion. All the modified layer 32 and the a layers and the b layers constituting the laminated portion 34 are not visible because FIG. 3 has a low magnification.

Figure 10:
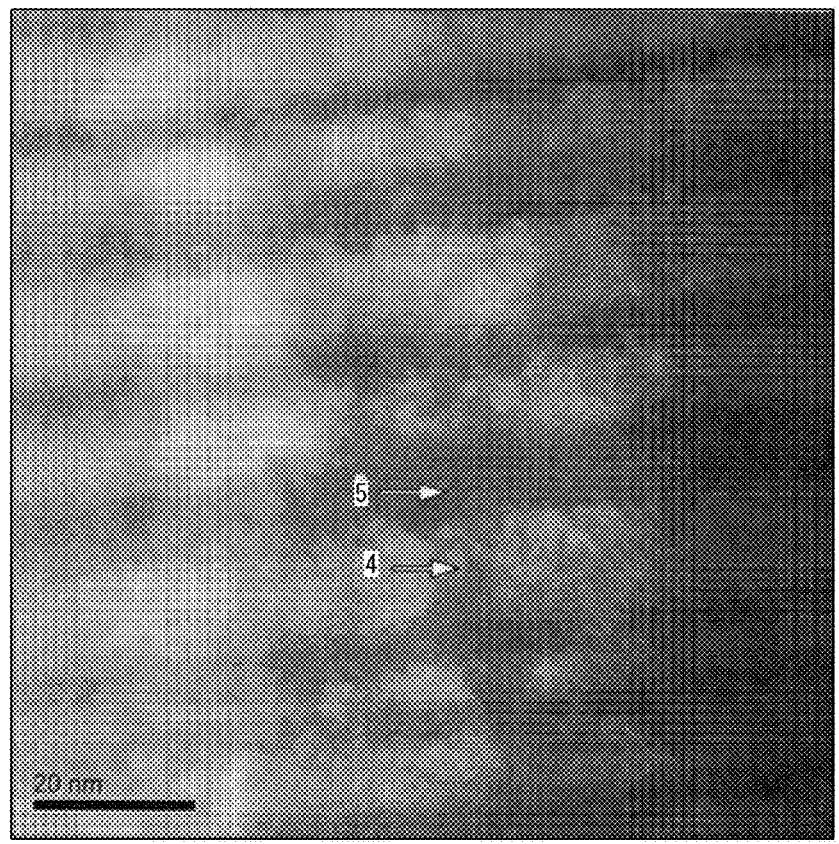
FIG. 10 is a dark-field image (magnification of 1,600,000 times) by a transmission electron microscope (TEM) in which the laminated portion of Example 1 is enlarged.

(6) Each Coating Thickness of Hard Coating and Lamination Period of Laminated Portion The coating thicknesses at the left end and the right end were respectively measured in the base material side single layer portion 33 and the laminated portion 34 of FIG. 3, and the measured values were arithmetically averaged to obtain the coating thickness (t1) of the base material side single layer portion 33 and the coating thickness (t2) of the entirety of the laminated portion 34. In addition, a sample for observation of a transmission electron microscope (TEM, JEM-2100 manufactured by JEOL Ltd.) was prepared from the laminated portion 34 in FIG. 3, and a dark-field image (magnification 1,600,000 times) obtained by photographing the laminated portion of the sample with the TEM is shown in FIG. 10. The lamination period T at the center positions of the a layers and the b layers alternately laminated from the upper side to the lower side of the laminated portion in FIG. 10 was measured, and the measured values were arithmetically averaged to obtain T. T was 20 nm.

(7) Composition of Hard Coating

The composition of the base material side single layer portion was analyzed by measuring the center position of the base material side single layer portion in the thickness direction in a cross-section of the coated cutting tool by an electron probe microanalyzer EPMA (JXA-8500F manufactured by JEOL Ltd.) under the conditions of an acceleration voltage of 10 kV, an irradiation current of 0.05 A, and a beam diameter of 0.5 µm. Furthermore, quantitative analysis of N element and O element in the base material side single layer portion at the center position of the base material side single layer portion in the thickness direction was performed by EDS analysis using an energy dispersive X-ray spectrometer (EDS, UTW type Si(Li) semiconductor detector manufactured by NORAN, beam diameter: about 1 µm) mounted on a TEM (JEM-2100). The measurement conditions of EPMA and EDS analysis are the same in other examples.

(8) X-Ray Diffraction Pattern of Hard Coating

Figure 6:
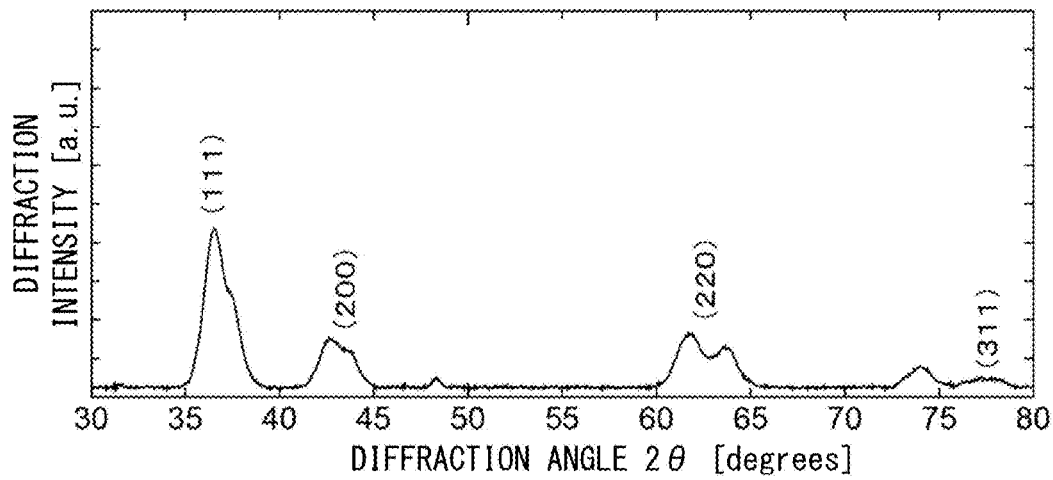
FIG. 6 is a graph showing an X-ray diffraction pattern of a portion of a hard coating in a cross section of the coated cutting tool of Example 1 in which a base material is covered with a base material side single layer portion and a laminated portion.

In order to observe the crystal structure of a portion of the hard coating formed of the base material side single layer portion and the laminated portion in the cross section of the coated cutting tool, the surface of the hard coating was irradiated with CuKα1 radiation (wavelength λ: 0.15405 nm) using an X-ray diffractometer (EMPYREAN manufactured by Panalytical) under the following conditions to obtain an X-ray diffraction pattern (FIG. 6).

Tube voltage: 45 kV
Tube current: 40 mA
Angle of incidence ω: fixed at 3°
2θ: 20° to 90°

In FIG. 6, all the (111) plane, the (200) plane, the (220) plane, and the (311) plane corresponded to X-ray diffraction peaks of the fcc structure. Therefore, it can be seen that the portion of the hard coating had a single fcc structure. In FIG. 6, the X-ray diffraction peaks that are not indexed are the X-ray diffraction peaks of the WC-based cemented carbide base material.

(9) Composition and Crystal Structure of Laminated Portion

EDS analysis was performed on each of a position 4 of a white part and a position 5 of a black part in the dark-field image of the TEM in FIG. 10 by the UTW type Si(Li) semiconductor detector attached to the TEM (TEM-2100). As a result, the metal (including metalloid) composition at the position 4 (a layer) of the white part was $(Ti_{0.90}B_{0.01}Al_{0.08}Cr_{0.01})$. In addition, the metal (including the metalloid) composition at the position 5 (b layer) in the black part was $(Al_{0.57}Cr_{0.033}B_{0.02}Ti_{0.08})$.

Figure 11:
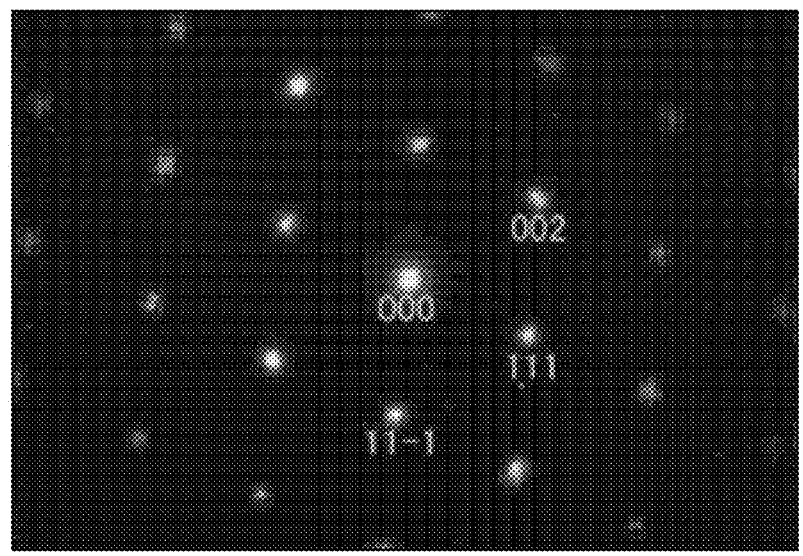
FIG. 11 is a photograph showing a crystal structure analyzed from a nanobeam diffraction pattern of an a layer at a position 4 of the laminated portion in FIG. 10.
Figure 12:
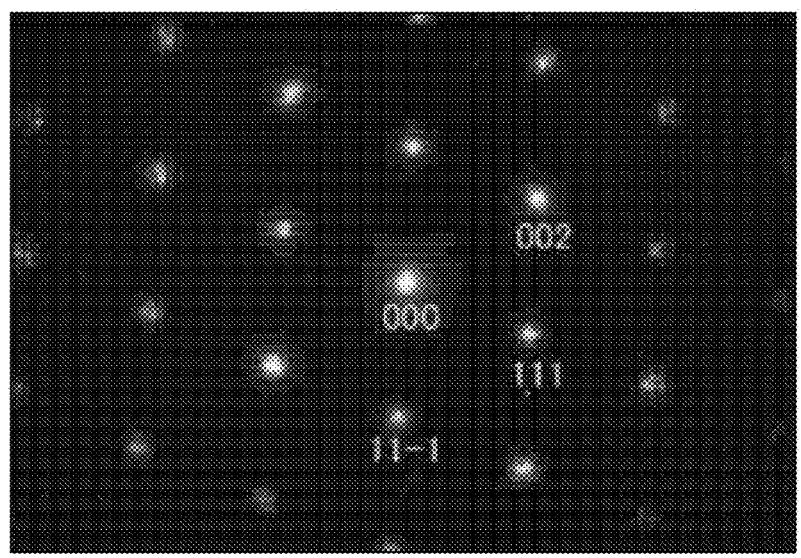
FIG. 12 is a photograph showing a crystal structure analyzed from a nanobeam diffraction pattern of a b layer at a position 5 in the laminated portion in FIG. 10.

At the positions 4 and 5 in FIG. 10, nanobeam diffraction was performed with a TEM (JEM-2100) under the conditions of an acceleration voltage of 200 kV and a camera length of 50 cm. A diffraction image obtained at the position 4 is shown in FIG. 11. A diffraction image obtained at the position 5 is shown in FIG. 12. In both of FIGS. 11 and 12, diffraction patterns of the (002) plane, the (111) plane, and the (11-1) plane of the fcc structure were observed. From this result, it was found that the electron diffraction pattern of the laminated portion of the present example also had a single fcc structure.

(10) Measurement of Tool Life

Figure 14:
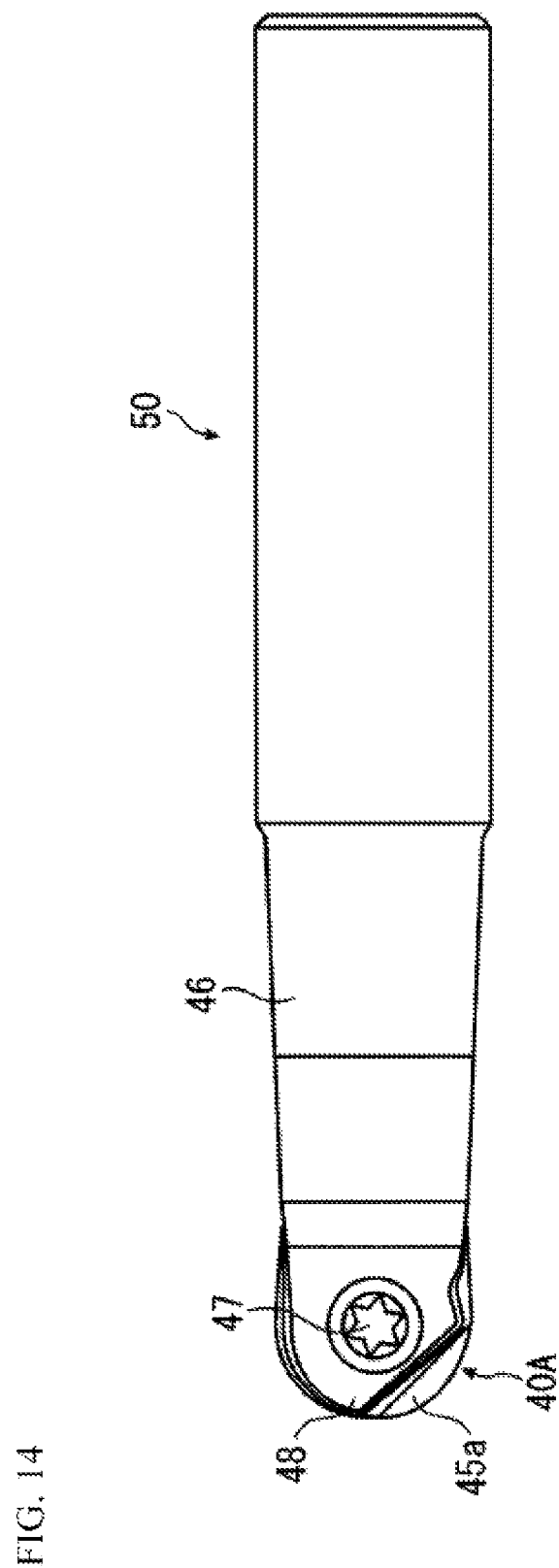
FIG. 14 is a schematic view illustrating an example of an indexable rotary tool equipped with an insert.

As illustrated in FIGS. 13 and 14, the above-mentioned coated cutting tool (hereinafter, also referred to as insert 40A) was mounted on a tip end portion 48 of a tool body 46 of an indexable rotary tool (ABPF30S32L150 manufactured by Mitsubishi Hitachi Tool Engineering, Ltd.) 50 by a set screw 47. The edge diameter of the indexable rotary tool 50 was 30 mm. Using the indexable rotary tool 50, cutting work was performed under the following milling conditions, a rake face 45a and a flank face 45b of the insert 40A sampled every unit time were observed with an optical microscope (magnification: 100 times), and the working time when the wear width or chipping width of any of the rake face 45a or the flank face 45b was 0.2 mm was determined as the tool life.

Cutting work conditions
Working method: Continuous milling
Work material: S50C square bar (HB220) of 120 mm×250 mm
Insert used: ZDFG300-SC (for milling)
Cutting tool: ABPF30S32L150
Cutting speed: 380 m/min
Feed rate per edge: 0.3 mm/edge
Axial depth of cut: 0.3 mm
Radial depth of cut: 0.1 mm
Cutting fluid: None (dry work)

Table 1 shows the compositions of the AlCrB alloy target and the TiB alloy target used. Table 2 shows the coating formation conditions for the base material side single layer portion. Table 3 shows the DC bias voltage applied at the time of coating formation of the laminated portion. Table 4 shows the composition of the base material side single layer portion. Table 5 shows the metal (including metalloid) composition of the a layer, and Table 6 shows the metal (including metalloid) composition of the b layer. Table 8 shows the respective coating thicknesses t1 and t2 of the base material side single layer portion and the entirety of the laminated portion, the coating thickness ratio t1/t2 of the base material side single layer portion to the entirety of the laminated portion, and the lamination period T of the laminated portion. Table 9 shows the results of X-ray diffraction of the portion of the hard coating formed of the base material side single layer portion and the laminated portion, the results of electron diffraction of the a layer and the b layer, and the tool life.

Example 2

By adjusting the coating formation time of each of the base material side single layer portion and the laminated portion, the coating thickness t1 was changed to 1.0 µm, the coating thickness t2 was changed to 0.8 µm, and the coating thickness ratio t1/t2 was changed to 1.25, and the lamination period T was changed to 16 nm. A coated cutting tool (milling insert) of the present example was produced in the same manner as in Example 1 except for the above, and the tool life and the like were measured.

Example 3

By adjusting the coating formation time of the base material side single layer portion, the coating thickness t1 was changed to 5.0 µm and the coating thickness ratio t1/t2 was changed to 5. A coated cutting tool (milling insert) of the present example was produced in the same manner as in Example 1 except for the above, and the tool life and the like were measured.

Example 4

In the same manner as in Example 1 except that the coating thickness t1 was set to 1.2 µm by adjusting the coating formation time of the base material side single layer portion, the base material side single layer portion and the laminated portion were sequentially formed on the base material on which the modified layer was formed. Subsequently, under the same coating formation conditions as those of the base material side single layer portion except that the coating formation time was adjusted, a hard coating having a composition of $(Al_{0.60}Cr_{0.38}B_{0.02})N_{0.994}O_{0.006}$ (atomic ratio) and a coating thickness (t3) of 1.2 µm was formed on the laminated portion as a surface side single layer portion. Thus, a coated cutting tool (milling insert) of the present example in which the coating thickness ratio t1/t2 was changed to 1.2, the coating thickness ratio t3/t2 was changed to 1.2, the coating thickness ratio (t1+t3)/t2 was changed to 2.4, and the coating thickness ratio t3/t1 was changed to 1 was produced, and the tool life and the like were measured.

Example 5

In the same manner as in Example 1 except that the coating formation time of the base material side single layer portion was adjusted, a base material side single layer portion having a coating thickness t1 of 4.0 µm and a laminated portion having a coating thickness t2 of 1.0 µm were sequentially formed on the base material on which the modified layer was formed. Subsequently, under the same coating formation conditions as those of the base material side single layer portion except that the coating formation time was adjusted, a hard coating having a composition of $(Al_{0.60}Cr_{0.38}B_{0.02})N_{0.994}O_{0.006}$ (atomic ratio) and a coating thickness (t3) of 3.0 µm was formed on the laminated portion as a surface side single layer portion. Thus, a coated cutting tool (milling insert) of the present example in which the coating thickness ratio t1/t2 was changed to 4, the coating thickness ratio t3/t2 was changed to 3, the coating thickness ratio (t1+t3)/t2 was changed to 7, and the coating thickness ratio t3/t1 was changed to 0.75 was produced, and the tool life and the like were measured.

Example 6

In the same manner as in Example 1, the base material side single layer portion and the laminated portion were sequentially formed on the base material on which the modified layer was formed. Subsequently, under the same coating formation conditions as those of the base material side single layer portion except that the coating formation time was adjusted, a hard coating having a composition of $(Al_{0.60}Cr_{0.38}B_{0.02})N_{0.994}O_{0.005}$ (atomic ratio) and a coating thickness (t3) of 0.5 µm was formed on the laminated portion as a surface side single layer portion. Thus, a coated cutting tool (milling insert) of the present example in which the coating thickness ratio t1/t2 was changed to 2, the coating thickness ratio t3/t2 was changed to 0.5, the coating thickness ratio (t1+t3)/t2 was changed to 2.5, and the coating thickness ratio t3/t1 was changed to 0.25 was produced, and the tool life and the like were measured.

Figure 4:
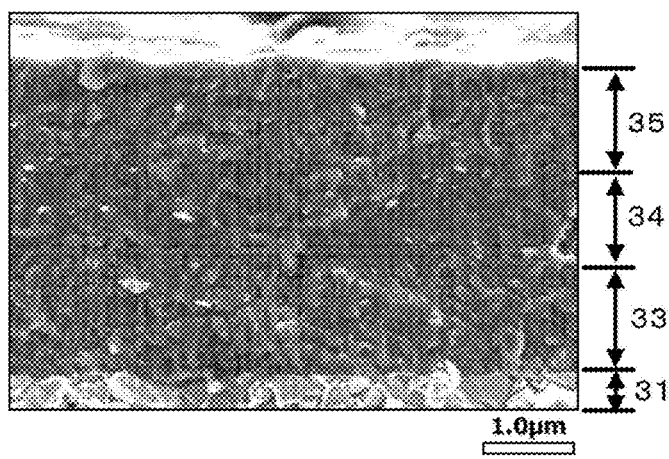
FIG. 4 is a scanning electron microscope (SEM) photograph (magnification: 20,000 times) showing a cross section of a coated cutting tool of Example 4.
Figure 7:
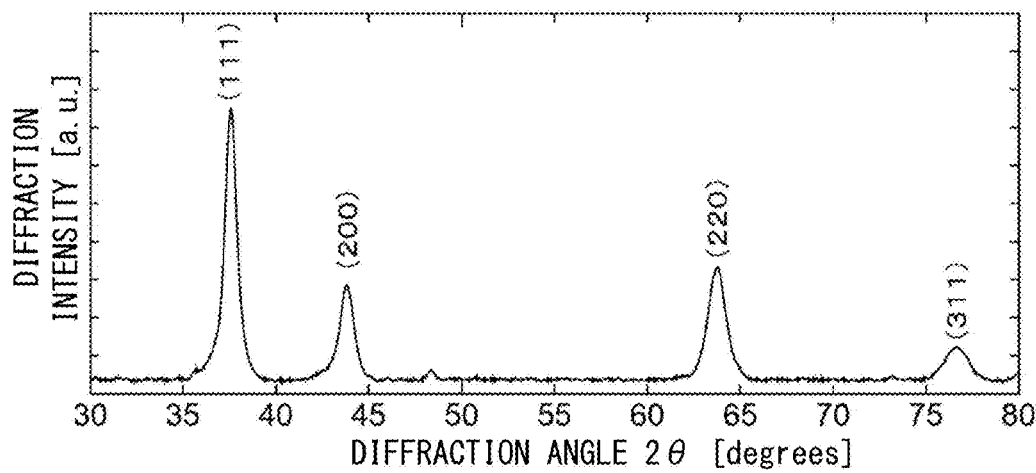
FIG. 7 is a graph showing an X-ray diffraction pattern of a portion of a hard coating in a cross section of the coated cutting tool of Example 4 in which a base material is covered with a base material side single layer portion, a laminated portion, and a surface side single layer portion.

FIG. 4 is a scanning electron microscope (SEM) photograph (magnification: 20,000 times) showing a cross-sectional structure of the coated cutting tool of Example 4. In FIG. 4, 31 denotes the WC-based cemented carbide base material, 33 denotes the base material side single layer portion, 34 denotes the laminated portion, and 35 denotes the surface side single layer portion. All the modified layer 32 and the a layers and the b layers constituting the laminated portion 34 are not visible because FIG. 4 has a low magnification. FIG. 7 shows an X-ray diffraction pattern of a portion of the hard coating formed of the base material side single layer portion, the laminated portion, and the surface side single layer portion of Example 4. It can be seen from FIG. 7 that the portion of the hard coating of Example 4 has a single fcc structure.

Figure 5:
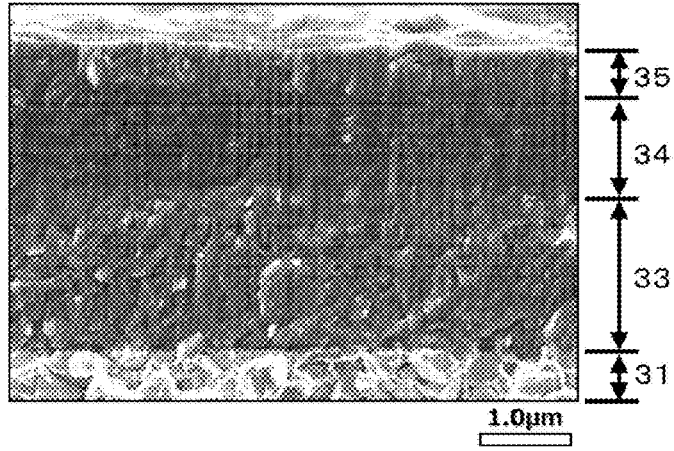
FIG. 5 is a scanning electron microscope (SEM) photograph (magnification: 20,000 times) showing a cross section of a coated cutting tool of Example 6.
Figure 8:
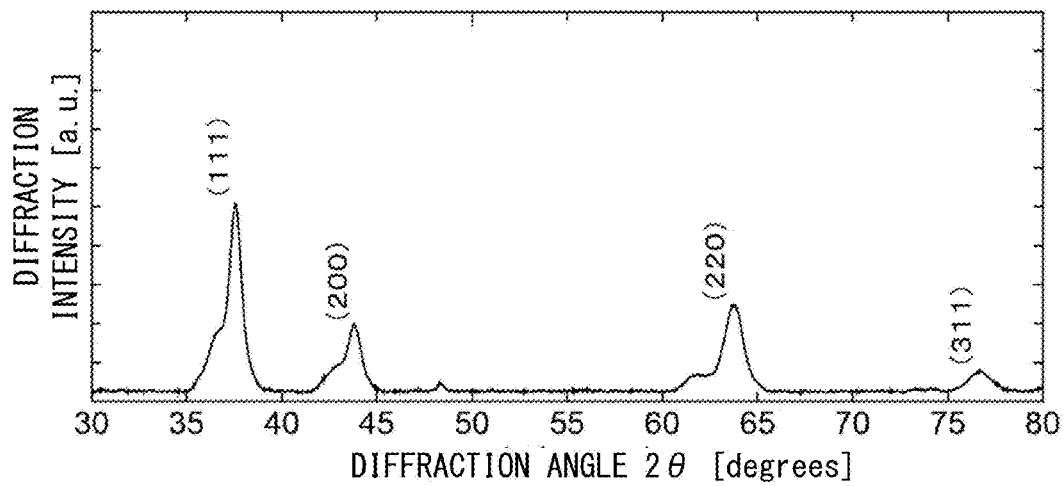
FIG. 8 is a graph showing an X-ray diffraction pattern of a portion of a hard coating in a cross section of the coated cutting tool of Example 6 in which a base material is coated with a base material side single layer portion, a laminated portion, and a surface side single layer portion.

FIG. 5 is a scanning electron microscope (SEM) photograph (magnification: 20,000 times) showing a cross-sectional structure of the coated cutting tool of Example 6. In FIG. 5, 31 denotes the WC-based cemented carbide base material, 33 denotes the base material side single layer portion, 34 denotes the laminated portion, and 35 denotes the surface side single layer portion. All the modified layer 32 and the a layers and the b layers constituting the laminated portion 34 are not visible because FIG. 5 has a low magnification. FIG. 8 shows an X-ray diffraction pattern of a portion of the hard coating formed of the base material side single layer portion, the laminated portion, and the surface side single layer portion of Example 6. It can be seen from FIG. 8 that the portion of the hard coating of Example 6 has a single fcc structure.

Table 1 shows the compositions of the AlCrB alloy target and the TiB alloy target of Examples 2 to 6. Table 2 shows the coating formation conditions for the base material side single layer portion of each example. Table 3 shows the bias voltage of the laminated portion of each example. Table 4 shows the composition of the base material side single layer portion of each example. Table 5 shows the composition of the metal (including metalloid) elements of the a layer of each example, and Table 6 shows the composition of the metal (including metalloid) elements of the b layer of each example. Table 7 shows the composition of the surface side single layer portion of each of Examples 4 to 6. Table 8 shows the coating thicknesses t1, t2, and t3, the coating thickness ratios t1/t2, t3/t2, (t1+t3)/t2, and t3/t1 and the lamination period T of each of Examples 2 to 6. Table 9 shows the results of X-ray diffraction of the portion formed of the base material side single layer portion and the laminated portion and the portion formed of the base material side single layer portion, the laminated portion, and the surface side single layer portion, the results of electron diffraction of the a layer and the b layer of each example, and the tool life of each example.

Examples 7 to 13

A coated cutting tool (milling insert) of each example was produced in the same manner as in Example 1 except that the AlCrB alloy target and the TiB alloy target of each example shown in Table 1 were used, the coating formation conditions of the base material side single layer portion of each example shown in Table 2 were used, and the bias voltage of the laminated portion of each example shown in Table 3 was used. In Example 7, the amount of Al(Cr) added to the AlCrB alloy target was changed from that in Example 1. In Examples 8 and 9, the amount of B added to the AlCrB alloy target was greatly changed from that of Example 1. In Examples 10 and 13, the total pressure of nitrogen gas was changed from that in Example 1. In Example 11, the bias voltage was changed compared to Example 9. In Example 12, the oxygen content of the AlCrB alloy target was greatly increased compared to Example 1. Table 1 shows the compositions of the AlCrB alloy target and the TiB alloy target of each example. Table 2 shows the coating formation conditions for the base material side single layer portion of each example. Table 3 shows the bias voltage of the laminated portion of each example. Table 4 shows the composition of the base material side single layer portion in each example. Table 5 shows the composition of the metal (including metalloid) elements of the a layer of each example, and Table 6 shows the composition of the metal (including metalloid) elements of the h layer of each example. Table 8 shows the coating thicknesses t1 and t2, the coating thickness ratio t1/t2, and the lamination period T of each example. Table 9 shows the result of X-ray diffraction of the portion formed of the base material side single layer portion and the laminated portion, the results of electron diffraction of the a layer and the b layer of each example, and the tool life of each example.

Comparative Example 1

Figure 9:
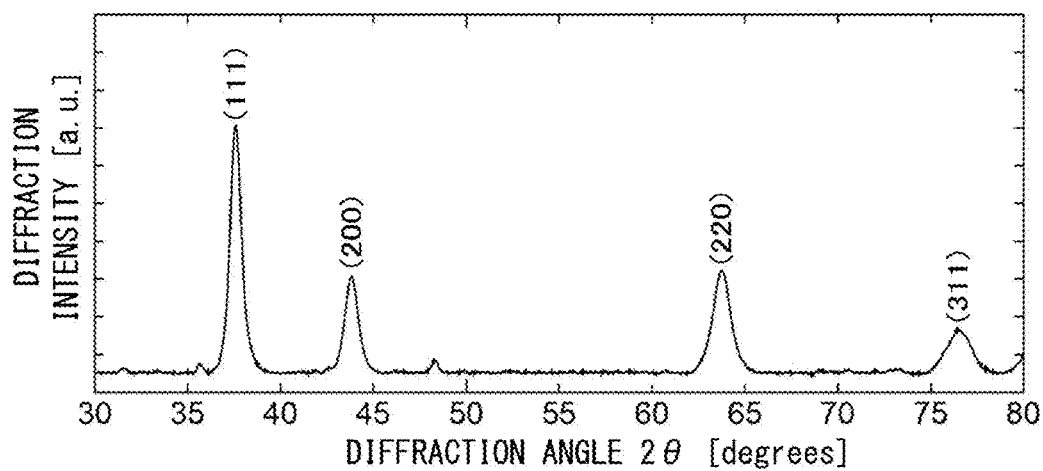
FIG. 9 is a graph showing an X-ray diffraction pattern of a portion of a hard coating in a cross section of a coated cutting tool of Comparative Example 1.

A coated cutting tool (milling insert) of the present comparative example, in which only the base material side single layer portion was formed on the same kind of base material as in Example 1, was prepared in the same manner as in Example 1 except that the AlCrB alloy target shown in Table 1 was used, the total pressure of the nitrogen gas atmosphere in the decompression container 25 during coating formation was set to 2 Pa, the flow rate of nitrogen gas was set to 700 sccm, and the DC bias voltage was set to −120 V, and the tool life was measured. FIG. 9 shows an X-ray diffraction pattern of the base material side single layer portion of the coated cutting tool of Comparative Example 1.

Comparative Example 2

A coated cutting tool (milling insert) of the present comparative example, in which only the base material side single layer portion was formed on the same kind of base material as in Example 1, was prepared in the same manner as in Example 1 except that the AlCrB alloy target shown in Table 1 was used, the total pressure of the nitrogen gas atmosphere in the decompression container 25 during coating formation was set to 3.5 Pa, the flow rate of nitrogen gas was set to 900 sccm, and the DC bias voltage was set to −120 V, and the tool life and the like were measured.

Comparative Example 3

A coated cutting tool (milling insert) of the present comparative example, in which only the base material side single layer portion was formed on the same kind of base material as in Example 1, was prepared in the same manner as in Example 1 except that the AlCrB alloy target having an excessively low oxygen content (420 μg/g) shown in Table 1 was used and the DC bias voltage was set to −120 V, and the tool life and the like were measured.

Comparative Example 4

A coated cutting tool (milling insert) of the present comparative example, in which only the base material side single layer portion was formed on the same kind of base material as in Example 1, was prepared in the same manner as in Example 1 except that the AlCrB alloy target having an excessively high oxygen content (5390 μg/g) shown in Table 1 was used and the DC bias voltage was set to −120 V, and the tool life and the like were measured.

Example 14

A coated cutting tool (milling insert) of the present example was produced in the same manner as in Example 1 except that the modified layer using the TiB alloy target was not formed on the WC-based cemented carbide base material, and the tool life and the like were measured.

Examples 15 to 17

Coated cutting tools (milling inserts) of the present examples were produced in the same manner as in Example 1 except that the AlCrBC alloy target of each example shown in Table 1 was used, and the tool life and the like were measured.

Table 1 shows the compositions of the target made of the AlCrB alloy or AlCrBC alloy and the TiB alloy target of each example used in Examples 14 to 17 and Comparative Examples 1 to 4. Table 2 shows the coating formation conditions for the base material side single layer portion of each example. Table 3 shows the DC bias voltage applied during the coating formation of the laminated portion of each example. Table 4 shows the composition of the base material side single layer portion in each example. Table 5 shows the composition of the metal (including metalloid) elements of the a layer of each example, and Table 6 shows the composition of the metal (including metalloid) elements of the b layer of each example. Table 8 shows the coating thicknesses t1 and t2, the coating thickness ratio t1/t2, and the lamination period T of each example. Table 9 shows the result of X-ray diffraction of the portion of the hard coating of each example formed of the base material side single layer portion and the laminated portion, the results of electron diffraction of the a layer and the b layer of each example, and the tool life of each example.

Table 10 shows the ratio I(200)/I(111) and the ratio I(311)/I(111) read from each of the X-ray diffraction patterns (FIGS. 6 to 9) of the portions of the hard coatings of Examples 1, 4, and 6 and Comparative Example 1.

TABLE 1

| | Composition of Target | | | | | | |
|---|---|---|---|---|---|---|---|
| | AlCrB alloy or AlCrBC alloy | | | | | TiB alloy | |
| Example No. | Al ($\alpha$) | Cr ($1-\alpha-\beta-\gamma$) | B ($\beta$) | C ($\gamma$) | O ($\mu g/g$) | Ti ($1-\delta$) | B ($\delta$) |
| Example 1 | 0.55 | 0.35 | 0.10 | — | 2300 | 0.85 | 0.15 |
| Example 2 | 0.55 | 0.35 | 0.10 | — | 2300 | 0.85 | 0.15 |
| Example 3 | 0.55 | 0.35 | 0.10 | — | 2300 | 0.85 | 0.15 |
| Example 4 | 0.55 | 0.35 | 0.10 | — | 2300 | 0.85 | 0.15 |
| Example 5 | 0.55 | 0.35 | 0.10 | — | 2300 | 0.85 | 0.15 |
| Example 6 | 0.55 | 0.35 | 0.10 | — | 2300 | 0.85 | 0.15 |
| Example 7 | 0.77 | 0.14 | 0.09 | — | 2190 | 0.85 | 0.15 |
| Example 8 | 0.58 | 0.27 | 0.15 | — | 2320 | 0.85 | 0.15 |
| Example 9 | 0.58 | 0.36 | 0.06 | — | 2200 | 0.85 | 0.15 |
| Example 10 | 0.59 | 0.31 | 0.10 | — | 2100 | 0.85 | 0.15 |
| Example 11 | 0.57 | 0.36 | 0.07 | — | 2360 | 0.85 | 0.15 |
| Example 12 | 0.60 | 0.30 | 0.10 | — | 2970 | 0.85 | 0.15 |
| Example 13 | 0.59 | 0.31 | 0.10 | — | 2100 | 0.85 | 0.15 |
| Example 14 | 0.59 | 0.31 | 0.10 | — | 2250 | 0.85 | 0.15 |
| Example 15 | 0.55 | 0.335 | 0.10 | 0.015 | 2300 | 0.85 | 0.15 |
| Example 16 | 0.55 | 0.325 | 0.10 | 0.025 | 2300 | 0.85 | 0.15 |
| Example 17 | 0.55 | 0.315 | 0.10 | 0.035 | 2300 | 0.85 | 0.15 |
| Comparative Example 1 | 0.59 | 0.31 | 0.10 | — | 2240 | — | — |
| Comparative Example 2 | 0.59 | 0.31 | 0.10 | — | 2220 | — | — |
| Comparative Example 3 | 0.59 | 0.31 | 0.10 | — | 420 | — | — |
| Comparative Example 4 | 0.59 | 0.31 | 0.10 | — | 5390 | — | — |

TABLE 2

| | Coating formation conditions for base material side single layer portion | | | |
|---|---|---|---|---|
| Example No. | Total pressure[1] (Pa) | Nitrogen gas flow rate (sccm) | Arc current[2] (A) | DC bias voltage[3] (V) |
| Example 1 | 3.0 | 800 | 200 | −140 |
| Example 2 | 3.0 | 800 | 200 | −140 |
| Example 3 | 3.0 | 800 | 200 | −140 |
| Example 4 | 3.0 | 800 | 200 | −140 |
| Example 5 | 3.0 | 800 | 200 | −140 |
| Example 6 | 3.0 | 800 | 200 | −140 |
| Example 7 | 3.0 | 800 | 200 | −120 |
| Example 8 | 3.0 | 800 | 200 | −120 |
| Example 9 | 3.0 | 800 | 200 | −120 |
| Example 10 | 2.7 | 770 | 200 | −120 |
| Example 11 | 3.0 | 800 | 200 | −160 |
| Example 12 | 3.0 | 800 | 200 | −120 |
| Example 13 | 3.3 | 900 | 200 | −120 |
| Example 14 | 3.0 | 800 | 200 | −120 |
| Example 15 | 3.0 | 800 | 200 | −140 |
| Example 16 | 3.0 | 800 | 200 | −140 |
| Example 17 | 3.0 | 800 | 200 | −140 |
| Comparative Example 1 | 2 | 700 | 200 | −120 |
| Comparative Example 2 | 3.5 | 900 | 200 | −120 |
| Comparative Example 3 | 3.0 | 800 | 200 | −120 |
| Comparative Example 4 | 3.0 | 800 | 200 | −120 |

Note:
[1]Pressure of the nitrogen gas atmosphere.
[2]Applied to the target made of AlCrB alloy or AlCrBC alloy.
[3]Applied to the base material.

TABLE 3

| | Coating formation conditions for laminated portion |
|---|---|
| Example No. | DC bias voltage[1] (V) |
| Example 1 | −120 |
| Example 2 | −120 |
| Example 3 | −120 |
| Example 4 | −120 |
| Example 5 | −120 |
| Example 6 | −120 |
| Example 7 | −100 |
| Example 8 | −100 |
| Example 9 | −100 |
| Example 10 | −100 |
| Example 11 | −140 |
| Example 12 | −100 |
| Example 13 | −100 |
| Example 14 | −100 |
| Example 15 | −120 |
| Example 16 | −120 |
| Example 17 | −120 |
| Comparative Example 1 | — |
| Comparative Example 2 | — |
| Comparative Example 3 | — |
| Comparative Example 4 | — |

Note:
[1]Applied to the base material.

TABLE 4

| | Coating Composition of base material side single layer portion | | | | | |
|---|---|---|---|---|---|---|
| Example No. | Al(x) | Cr(1−x−y) | B(y) | N(1−e−f) | C(e) | O(f) |
| Example 1 | 0.60 | 0.38 | 0.02 | 0.994 | — | 0.006 |
| Example 2 | 0.60 | 0.38 | 0.02 | 0.995 | — | 0.005 |
| Example 3 | 0.60 | 0.38 | 0.02 | 0.994 | — | 0.006 |
| Example 4 | 0.60 | 0.38 | 0.02 | 0.994 | — | 0.006 |
| Example 5 | 0.60 | 0.38 | 0.02 | 0.995 | — | 0.005 |
| Example 6 | 0.60 | 0.38 | 0.02 | 0.995 | — | 0.005 |
| Example 7 | 0.74 | 0.23 | 0.03 | 0.996 | — | 0.004 |
| Example 8 | 0.56 | 0.36 | 0.08 | 0.993 | — | 0.007 |
| Example 9 | 0.54 | 0.45 | 0.01 | 0.995 | — | 0.005 |
| Example 10 | 0.55 | 0.42 | 0.03 | 0.996 | — | 0.004 |
| Example 11 | 0.52 | 0.46 | 0.02 | 0.993 | — | 0.007 |
| Example 12 | 0.55 | 0.42 | 0.03 | 0.991 | — | 0.009 |
| Example 13 | 0.54 | 0.42 | 0.04 | 0.996 | — | 0.004 |
| Example 14 | 0.54 | 0.42 | 0.04 | 0.995 | — | 0.005 |
| Example 15 | 0.60 | 0.38 | 0.02 | 0.984 | 0.01 | 0.006 |
| Example 16 | 0.60 | 0.38 | 0.02 | 0.975 | 0.02 | 0.005 |
| Example 17 | 0.60 | 0.38 | 0.02 | 0.965 | 0.03 | 0.005 |
| Comparative Example 1 | 0.57 | 0.38 | 0.05 | 0.988 | — | 0.012 |
| Comparative Example 2 | 0.56 | 0.40 | 0.04 | 0.999 | — | 0.001 |
| Comparative Example 3 | 0.55 | 0.40 | 0.05 | 0.999 | — | 0.001 |
| Comparative Example 4 | 0.53 | 0.43 | 0.04 | 0.984 | — | 0.016 |

TABLE 5

| | a layer Composition of metal (including metalloid) elements | | | |
|---|---|---|---|---|
| Example No. | Ti | B | Al | Cr |
| Example 1 | 0.90 | 0.01 | 0.08 | 0.01 |
| Example 2 | 0.90 | 0.02 | 0.07 | 0.01 |
| Example 3 | 0.89 | 0.01 | 0.08 | 0.02 |
| Example 4 | 0.90 | 0.01 | 0.06 | 0.03 |
| Example 5 | 0.90 | 0.02 | 0.06 | 0.02 |
| Example 6 | 0.90 | 0.01 | 0.08 | 0.01 |

TABLE 5-continued

| | a layer Composition of metal (including metalloid) elements | | | |
|---|---|---|---|---|
| Example No. | Ti | B | Al | Cr |
| Example 7 | 0.87 | 0.01 | 0.10 | 0.02 |
| Example 8 | 0.87 | 0.01 | 0.08 | 0.04 |
| Example 9 | 0.90 | 0.01 | 0.07 | 0.02 |
| Example 10 | 0.88 | 0.01 | 0.09 | 0.02 |
| Example 11 | 0.88 | 0.02 | 0.08 | 0.02 |
| Example 12 | 0.88 | 0.02 | 0.08 | 0.02 |
| Example 13 | 0.87 | 0.01 | 0.07 | 0.05 |
| Example 14 | 0.89 | 0.01 | 0.06 | 0.04 |
| Example 15 | 0.90 | 0.01 | 0.08 | 0.01 |
| Example 16 | 0.90 | 0.01 | 0.08 | 0.01 |
| Example 17 | 0.90 | 0.01 | 0.08 | 0.01 |
| Comparative Example 1 | — | — | — | — |
| Comparative Example 2 | — | — | — | — |
| Comparative Example 3 | — | — | — | — |
| Comparative Example 4 | — | — | — | — |

TABLE 6

| | b layer Composition of metal (including metalloid) elements | | | |
|---|---|---|---|---|
| Example No. | Al | Cr | B | Ti |
| Example 1 | 0.57 | 0.33 | 0.02 | 0.08 |
| Example 2 | 0.58 | 0.34 | 0.01 | 0.07 |
| Example 3 | 0.57 | 0.35 | 0.02 | 0.06 |
| Example 4 | 0.58 | 0.33 | 0.02 | 0.07 |
| Example 5 | 0.58 | 0.34 | 0.01 | 0.07 |
| Example 6 | 0.59 | 0.34 | 0.02 | 0.05 |
| Example 7 | 0.78 | 0.12 | 0.03 | 0.07 |
| Example 8 | 0.58 | 0.28 | 0.08 | 0.06 |
| Example 9 | 0.59 | 0.35 | 0.01 | 0.05 |
| Example 10 | 0.60 | 0.32 | 0.03 | 0.05 |
| Example 11 | 0.58 | 0.33 | 0.02 | 0.07 |
| Example 12 | 0.61 | 0.28 | 0.03 | 0.08 |
| Example 13 | 0.59 | 0.32 | 0.03 | 0.06 |
| Example 14 | 0.59 | 0.31 | 0.04 | 0.06 |
| Example 15 | 0.57 | 0.33 | 0.02 | 0.08 |
| Example 16 | 0.57 | 0.33 | 0.02 | 0.08 |
| Example 17 | 0.57 | 0.33 | 0.02 | 0.08 |
| Comparative Example 1 | — | — | — | — |
| Comparative Example 2 | — | — | — | — |
| Comparative Example 3 | — | — | — | — |
| Comparative Example 4 | — | — | — | — |

TABLE 7

| | Coating Composition of for surface side single layer portion | | | | | |
|---|---|---|---|---|---|---|
| Example No. | Al(x) | Cr(1-x-y) | B(y) | N(1-e-f) | C(e) | f(f) |
| Example 1 | — | — | — | — | — | — |
| Example 2 | — | — | — | — | — | — |
| Example 3 | — | — | — | — | — | — |
| Example 4 | 0.60 | 0.38 | 0.02 | 0.994 | — | 0.006 |
| Example 5 | 0.60 | 0.38 | 0.02 | 0.994 | — | 0.006 |
| Example 6 | 0.60 | 0.38 | 0.02 | 0.995 | — | 0.005 |
| Example 7 | — | — | — | — | — | — |
| Example 8 | — | — | — | — | — | — |
| Example 9 | — | — | — | — | — | — |
| Example 10 | — | — | — | — | — | — |
| Example 11 | — | — | — | — | — | — |
| Example 12 | — | — | — | — | — | — |
| Example 13 | — | — | — | — | — | — |
| Example 14 | — | — | — | — | — | — |
| Example 15 | — | — | — | — | — | — |
| Example 16 | — | — | — | — | — | — |
| Example 17 | — | — | — | — | — | — |
| Comparative Example 1 | — | — | — | — | — | — |
| Comparative Example 2 | — | — | — | — | — | — |
| Comparative Example 3 | — | — | — | — | — | — |
| Comparative Example 4 | — | — | — | — | — | — |

TABLE 8

| Example No. | $t1^{(1)}$ (μm) | $t2^{(2)}$ (μm) | $t3^{(3)}$ (μm) | $t1/t2^{(4)}$ | $t3/t2^{(5)}$ | $(t1+t3)/t2^{(6)}$ | $t3/t1^{(7)}$ | $T^{(8)}$ (nm) |
|---|---|---|---|---|---|---|---|---|
| Example 1 | 2.0 | 1.0 | — | 2 | — | — | — | 20 |
| Example 2 | 1.0 | 0.8 | — | 1.25 | — | — | — | 16 |
| Example 3 | 5.0 | 1.0 | — | 5 | — | — | — | 20 |
| Example 4 | 1.2 | 1.0 | 1.2 | 1.2 | 1.2 | 2.4 | 1 | 20 |
| Example 5 | 4.0 | 1.0 | 3.0 | 4 | 3 | 7 | 0.75 | 20 |
| Example 6 | 2.0 | 1.0 | 0.5 | 2 | 0.5 | 2.5 | 0.25 | 20 |
| Example 7 | 2.0 | 1.0 | — | 2 | — | — | — | 20 |
| Example 8 | 2.0 | 1.0 | — | 2 | — | — | — | 20 |
| Example 9 | 2.0 | 1.0 | — | 2 | — | — | — | 20 |
| Example 10 | 2.0 | 1.0 | — | 2 | — | — | — | 20 |
| Example 11 | 2.0 | 1.0 | — | 2 | — | — | — | 20 |
| Example 12 | 2.0 | 1.0 | — | 2 | — | — | — | 20 |
| Example 13 | 2.0 | 1.0 | — | 2 | — | — | — | 20 |
| Example 14 | 2.0 | 1.0 | — | 2 | — | — | — | 20 |
| Example 15 | 2.0 | 1.0 | — | 2 | — | — | — | 20 |
| Example 16 | 2.0 | 1.0 | — | 2 | — | — | — | 20 |
| Example 17 | 2.0 | 1.0 | — | 2 | — | — | — | 20 |
| Comparative Example 1 | 2.0 | — | — | — | — | — | — | — |
| Comparative Example 2 | 2.0 | — | — | — | — | — | — | — |
| Comparative Example 3 | 2.0 | — | — | — | — | — | — | — |
| Comparative Example 4 | 2.0 | — | — | — | — | — | — | — |

Note:
(1) Coating thickness of the base material side single layer portion.
(2) Coating thickness of the entire laminated portion.
(3) Coating thickness of the surface side single layer portion.
(4) Coating thickness ratio of the base material side single layer portion to the entire laminated portion.
(5) Coating thickness ratio of the surface side single layer portion to the entire laminated portion.
(6) Ratio of the sum of the coating thicknesses of the base material side single layer portion and the surface side single layer portion to the coating thickness of the entire laminated portion. Here, in a case where the surface side single layer portion is not formed, the surface side single layer portion is excluded from evaluation.
(7) Coating thickness ratio of the surface side single layer portion to the base material side single layer portion.
(8) Lamination period (arithmetic average value) of the a layers and the b layers of the laminated portion in the coating thickness direction.

TABLE 9

| Example No. | Portion of hard coating X-ray diffraction | a layer Electron diffraction | b layer Electron diffraction | Tool life (min) |
|---|---|---|---|---|
| Example 1 | fcc(1) | fcc | fcc | 780 |
| Example 2 | fcc(1) | fcc | fcc | 720 |
| Example 3 | fcc(1) | fcc | fcc | 760 |
| Example 4 | fcc(2) | fcc | fcc | 770 |
| Example 5 | fcc(2) | fcc | fcc | 750 |
| Example 6 | fcc(2) | fcc | fcc | 740 |
| Example 7 | fcc(1) | fcc | fcc | 770 |

TABLE 9-continued

| Example No. | Portion of hard coating X-ray diffraction | a layer Electron diffraction | b layer Electron diffraction | Tool life (min) |
|---|---|---|---|---|
| Example 8 | fcc[1] | fcc | fcc | 770 |
| Example 9 | fcc[1] | fcc | fcc | 740 |
| Example 10 | fcc[1] | fcc | fcc | 750 |
| Example 11 | fcc[1] | fcc | fcc | 760 |
| Example 12 | fcc[1] | fcc | fcc | 730 |
| Example 13 | fcc[1] | fcc | fcc | 740 |
| Example 14 | fcc[1] | fcc | fcc | 680 |
| Example 15 | fcc[1] | fcc | fcc | 780 |
| Example 16 | fcc[1] | fcc | fcc | 785 |
| Example 17 | fcc[1] | fcc | fcc | 780 |
| Comparative Example 1 | fcc[3] | — | — | 470 |
| Comparative Example 2 | fcc[3] | — | — | 450 |
| Comparative Example 3 | fcc[3] | — | — | 400 |
| Comparative Example 4 | fcc[3] | — | — | 360 |

Note:
[1]Results of X-ray diffraction of the portion constituted by the base material side single layer portion and the laminated portion.
[2]Results of X-ray diffraction of the portion constituted by the base material side single layer portion, the laminated portion, and the surface side single layer portion.
[3]Results of X-ray diffraction of only the base material side single layer portion.

As shown in Table 9, the indexable rotary tools of Examples 1 to 17 had a longer life than the indexable rotary tools of Comparative Examples 1 to 4. In particular, the indexable rotary tool of each of Examples 15 to 17 in which each (AlCrB)NCO coating (Table 4) containing 0.01 to 0.03 (atomic ratio) of C was formed as the base material side single layer portion had a life longer than or equal to that of the indexable rotary tool of Example 1. The indexable rotary tool of Example 14 in which the modified layer was not formed on the surface of the WC-based cemented carbide base material had a shorter life than the indexable rotary tool of each of Examples 1 to 13 and Examples 15 to 17, but had a longer life than the indexable rotary tool of each of Comparative Examples 1 to 4.

It is determined that since all the indexable rotary tools respectively equipped with the milling inserts of Comparative Examples 1 to 4 lack the laminated portion according to the present invention, good wear resistance cannot be exhibited and the life is shortened.

TABLE 10

| Example No. | I(200)/I(111) | I(311)/I(111) |
|---|---|---|
| Example 1 | 0.30 | 0.06 |
| Example 4 | 0.35 | 0.09 |
| Example 6 | 0.36 | 0.11 |
| Comparative Example 1 | 0.39 | 0.18 |

From Table 10, the ratio I(200)/I(111) was 0.30 in Example 1, 0.35 in Example 4, and 0.36 in Example 6. On the other hand, the ratio I(200)/I(111) in Comparative Example 1 was as large as 0.39. The ratio 1(311)/I(111) was 0.06 in Example 1, 0.09 in Example 4, and 0.11 in Example 6. On the other hand, the ratio I(311)/I(111) in Comparative Example 1 was as large as 0.18.

In the examples described above, the base material side single layer portion, the b layer, and the surface side single layer portion were formed into substantially the same composition by using the same target made of the AlCrB alloy or AlCrBC alloy, but there is no particular limitation. For example, the composition of any of the base material side single layer portion, the b layer of the laminated portion, and the surface side single layer portion may be appropriately changed within the range of the present invention using a target made of a plurality of AlCrB alloys or AlCrBC alloys having different compositions.

REFERENCE SIGNS LIST

1 Drive unit
2 Gas introduction portion
3 Bias power supply
6 Lower holder (support)
7 Base material
8 Upper holder
10, 18 Cathode material (target)
11, 12 Arc discharge power supply
13, 27 Arc discharge evaporation source
14 Insulator for fixing arc discharge evaporation source
15 Arc ignition mechanism bearing portion
16 Arc ignition mechanism
17 Exhaust port
19 Insulator for fixing electrode
20 Electrode
21 Shield plate bearing portion
22 Shield plate drive unit
23 Shield plate
24 Bearing portion
25 Decompression container
31 WC-based cemented carbide base material
32 Modified layer
33 Base material side single layer portion
34 Laminated portion
35 Surface side single layer portion
40A Milling insert (insert base material)
45a Rake face of insert
46 Tool body
47 Set screw for insert
48 Tip end portion of tool body
50 Coated cutting tool (indexable rotary tool)
a a layer
b b layer

The invention claimed is:

1. A coated cutting tool having a hard coating on a base material,
wherein a base material side single layer portion and a laminated portion are provided as the hard coating in order from a base material side,
the base material side single layer portion is formed of a nitride-based hard coating in which a proportion of Al is highest among metal (including metalloid) elements, a sum of Al and Cr in a content ratio (atomic ratio) is 0.9 or more, a content ratio (atomic ratio) of Al is 0.5 or more and 0.75 or less, and a content ratio (atomic ratio) of B is 0.01 or more and 0.1 or less,
in the laminated portion, a nitride-based a layer in which a proportion of Ti is highest among metal (including metalloid) elements and at least B is contained, and a nitride-based b layer in which a proportion of Al is highest among metal (including metalloid) elements and at least Cr and B are contained and a content ratio (atomic ratio) of Al is 0.42 or more and 0.86 or less and a content ratio (atomic ratio) of B is 0.01 or more and 0.08 or less, are alternately laminated,
a lamination period of the a layer and the b layer in a coating thickness direction is 5 to 100 nm, an X-ray diffraction pattern of a portion formed of the base material side single layer portion and the laminated portion has a single fcc structure, and the coating thickness of the base material side single layer portion is larger than the coating thickness of the entirety of the laminated portion.

2. The coated cutting tool according to claim 1, wherein a coating thickness (t1) of the base material side single layer portion is 1.0 to 5 µm,
a coating thickness (t2) of an entirety of the laminated portion is 0.5 to 2.5 µm, and
a coating thickness ratio (t1/t2) of the base material side single layer portion to the entirety of the laminated portion is 1.0 to 5.

3. The coated cutting tool according to claim 1, wherein a surface side single layer portion is provided on the laminated portion, and a coating thickness (t3) of the surface side single layer portion is 0.3 to 5 µm,
an X-ray diffraction pattern of a portion formed of the base material side single layer portion, the laminated portion, and the surface side single layer portion has a single fcc structure, and
the surface side single layer portion is formed of a nitride-based hard coating in which a proportion of Al is highest among metal (including metalloid) elements, a sum of Al and Cr in a content ratio (atomic ratio) is 0.9 or more, a content ratio (atomic ratio) of Al is 0.5 or more and 0.75 or less, and a content ratio (atomic ratio) of B is 0.01 or more and 0.1 or less.

4. The coated cutting tool according to claim 1, wherein, in an X-ray diffraction pattern of a portion formed of the base material side single layer portion and the laminated portion, a ratio I(200)/I(111) of an X-ray diffraction peak value I(200) of a (200) plane to an X-ray diffraction peak value I(111) of a (111) plane in the X-ray diffraction pattern is 0.2 to 0.37.

5. The coated cutting tool according to claim 1, wherein, in an X-ray diffraction pattern of a portion formed of the base material side single layer portion and the laminated portion, a ratio I(311)/I(111) of an X-ray diffraction peak value I(311) of a (311) plane to an X-ray diffraction peak value I(111) of a (111) plane in the X-ray diffraction pattern is 0.03 to 0.15.

6. A method for producing the coated cutting tool according to claim 1 by an arc ion plating method, wherein a target for forming the base material side single layer portion and the b layer is formed of an AlCrB alloy or AlCrBC alloy having a composition represented by the following general formula, excluding unavoidable impurities: $Al_\alpha Cr_{1-\alpha-\beta-\gamma} B_\beta C_\gamma$ (here, $\alpha$, $1-\alpha-\beta-\gamma$, $\beta$, and $\gamma$ are numbers that respectively represent atomic ratios of Al, Cr, B, and C, and satisfy $0.4 \leq \alpha \leq 0.8$, $0.04 \leq \beta \leq 0.165$, and $0 \leq \gamma \leq 0.035$),
a target for forming the a layer is formed of a TiB alloy having a composition represented by the following general formula, excluding unavoidable impurities: $Ti_{1-\delta} B_\delta$ (here, $1-\delta$ and $\delta$ are numbers that respectively represent atomic ratios of Ti and B, and satisfy $0.1 \leq \delta \leq 0.5$), and
in a nitrogen gas atmosphere with a total pressure of 2.7 to 3.3 Pa, a temperature of the base material is set to 400° C. to 550° C., a bias voltage applied to the base material when forming the base material side single layer portion is set to −160 to −100 V, and a bias voltage applied to the base material when forming the laminated portion is set to −140 to −80 V.

7. The method for producing the coated cutting tool according to claim 6, the method comprising:
a step of forming a surface side single layer portion on the laminated portion,
wherein a bias voltage applied to the base material when forming the surface side single layer portion is set to −160 to −100 V.

8. The method for producing the coated cutting tool according to claim 7,
wherein the same AlCrB alloy or AlCrBC alloy as that of the base material side single layer portion is used as a target for forming the surface side single layer portion.

9. The method for producing the coated cutting tool according to claim 6,
wherein an arc current is caused to flow simultaneously to the target for forming the
a layer and the target for forming the b layer when forming the laminated portion.

10. The coated cutting tool according to claim 2, wherein a surface side single layer portion is provided on the laminated portion, and a coating thickness (t3) of the surface side single layer portion is 0.3 to 5 µm,
an X-ray diffraction pattern of a portion formed of the base material side single layer portion, the laminated portion, and the surface side single layer portion has a single fcc structure, and
the surface side single layer portion is formed of a nitride-based hard coating in which a proportion of Al is highest among metal (including metalloid) elements, a sum of Al and Cr in a content ratio (atomic ratio) is 0.9 or more, a content ratio (atomic ratio) of Al is 0.5 or more and 0.75 or less, and a content ratio (atomic ratio) of B is 0.01 or more and 0.1 or less.

11. The coated cutting tool according to claim 2, wherein, in an X-ray diffraction pattern of a portion formed of the base material side single layer portion and the laminated portion, a ratio I(200)/I(111) of an X-ray diffraction peak value I(200) of a (200) plane to an X-ray diffraction peak value I(111) of a (111) plane in the X-ray diffraction pattern is 0.2 to 0.37.

12. The coated cutting tool according to claim 3, wherein, in an X-ray diffraction pattern of a portion formed of the base material side single layer portion, the laminated portion, and the surface side single layer portion, a ratio I(200)/I(111) of an X-ray diffraction peak value I(200) of a (200) plane to an X-ray diffraction peak value I(111) of a (111) plane in the X-ray diffraction pattern is 0.2 to 0.37.

13. The coated cutting tool according to claim 10, wherein, in an X-ray diffraction pattern of a portion formed of the base material side single layer portion, the laminated portion, and the surface side single layer portion, a ratio I(200)/I(111) of an X-ray diffraction peak value I(200) of a (200) plane to an X-ray diffraction peak value I(111) of a (111) plane in the X-ray diffraction pattern is 0.2 to 0.37.

14. The coated cutting tool according to claim 2, wherein, in an X-ray diffraction pattern of a portion formed of the base material side single layer portion and the laminated portion, a ratio 1(311)/I(111) of an X-ray diffraction peak value I(311) of a (311) plane to an X-ray diffraction peak value I(111) of a (111) plane in the X-ray diffraction pattern is 0.03 to 0.15.

15. The coated cutting tool according to claim 3, wherein, in an X-ray diffraction pattern of a portion formed of the base material side single layer portion, the laminated portion, and the surface side single layer portion, a ratio I(311)/I(111) of an X-ray diffraction peak value I(311) of a (311) plane to an X-ray diffraction peak value I(111) of a (111) plane in the X-ray diffraction pattern is 0.03 to 0.15.

16. The coated cutting tool according to claim 4, wherein, in an X-ray diffraction pattern of a portion formed of the base material side single layer portion and the laminated portion, a ratio I(311)/I(111) of an X-ray diffraction peak value I(311) of a (311) plane to an X-ray diffraction peak value I(111) of a (111) plane in the X-ray diffraction pattern is 0.03 to 0.15.

17. The coated cutting tool according to claim 10, wherein, in an X-ray diffraction pattern of a portion formed of the base material side single layer portion, the laminated portion, and the surface side single layer portion, a ratio I(311)/I(111) of an X-ray diffraction peak value I(311) of a (311) plane to an X-ray diffraction peak value I(111) of a (111) plane in the X-ray diffraction pattern is 0.03 to 0.15.

18. The coated cutting tool according to claim 11, wherein, in an X-ray diffraction pattern of a portion formed of the base material side single layer portion and the laminated portion, a ratio I(311)/I(111) of an X-ray diffraction peak value I(311) of a (311) plane to an X-ray diffraction peak value I(111) of a (111) plane in the X-ray diffraction pattern is 0.03 to 0.15.

19. The method for producing the coated cutting tool according to claim 7, wherein an arc current is caused to flow simultaneously to the target for forming the
a layer and the target for forming the b layer when forming the laminated portion.

20. The method for producing the coated cutting tool according to claim 8, wherein an arc current is caused to flow simultaneously to the target for forming the
a layer and the target for forming the b layer when forming the laminated portion.

* * * * *